(12) United States Patent
Oota

(10) Patent No.: US 8,355,254 B2
(45) Date of Patent: Jan. 15, 2013

(54) ELECTRONIC CONTROL UNIT

(75) Inventor: Shinsuke Oota, Kariya (JP)

(73) Assignee: Denso Corporation, Kariya (JP)

( * ) Notice: Subject to any disclaimer, the term of this patent is extended or adjusted under 35 U.S.C. 154(b) by 269 days.

(21) Appl. No.: 12/834,950

(22) Filed: Jul. 13, 2010

(65) Prior Publication Data
US 2011/0013365 A1 Jan. 20, 2011

(30) Foreign Application Priority Data
Jul. 16, 2009 (JP) .................................. 2009-168016

(51) Int. Cl.
H05K 7/20 (2006.01)
(52) U.S. Cl. ........ 361/719; 361/704; 361/715; 257/712; 174/520; 174/526
(58) Field of Classification Search ............. 361/679.02, 361/679.54, 701–722
See application file for complete search history.

(56) References Cited

U.S. PATENT DOCUMENTS

| 7,268,428 | B2 * | 9/2007 | Edwards et al. ............... 257/712 |
| 7,709,951 | B2 * | 5/2010 | Brodsky et al. ............... 257/713 |
| 2006/0012034 | A1 * | 1/2006 | Kadoya et al. ................ 257/712 |
| 2006/0134937 | A1 * | 6/2006 | Mayuzumi et al. ............ 439/61 |
| 2006/0171127 | A1 * | 8/2006 | Kadoya et al. ................ 361/752 |
| 2008/0191325 | A1 | 8/2008 | Shirasaka |
| 2009/0065180 | A1 * | 3/2009 | Wits et al. ................. 165/104.26 |
| 2010/0165680 | A1 | 7/2010 | Yoshinaga |

FOREIGN PATENT DOCUMENTS

| CN | 1731915 A | 2/2006 |
| CN | 1952847 A | 4/2007 |
| JP | 8-264688 | 10/1996 |
| JP | 2684893 | 8/1997 |
| JP | 9-293802 | 11/1997 |
| JP | 9-298275 | 11/1997 |
| JP | 2000-124400 | 4/2000 |
| JP | 2002-289750 | 10/2002 |
| JP | 2003-209217 | 7/2003 |
| JP | 2003-332500 | 11/2003 |
| JP | 2005-260198 | 9/2005 |
| JP | 2008-21819 | 1/2008 |
| JP | 2008-124167 | 5/2008 |

OTHER PUBLICATIONS

U.S. Appl. No. 12/834,944, Oota, filed Jul. 13, 2010.
Japanese Office Action dated Oct. 14, 2011, issued in corresponding Japanese Application No. 2009-168016 with English Translation.
Chinese Office Action dated Apr. 25, 2012, issued in corresponding Chinese Application No. 201010229235.X with English Translation.

* cited by examiner

Primary Examiner — Courtney Smith
(74) Attorney, Agent, or Firm — Nixon & Vanderhye P.C.

(57) ABSTRACT

An electronic control unit includes a circuit board, multiple circuit patterns, multiple semiconductor devices, multiple leads, and at least one thermal-conduction limiting portion. Each of the semiconductor devices is installed to the corresponding circuit pattern formed on the circuit board. Each of the leads electrically and mechanically connects each of the semiconductor devices to the corresponding circuit pattern. The thermal-conduction limiting portion, which can limit conduction of heat generated from the semiconductor devices, is placed between corresponding two of the circuit patterns.

28 Claims, 19 Drawing Sheets

ELECTRONIC CONTROL UNIT

CROSS REFERENCE TO RELATED APPLICATION

The present application is based on Japanese Patent Application No. 2009-168016 filed on Jul. 16, 2009, the disclosure of which is incorporated herein by reference.

FIELD OF THE INVENTION

The present invention relates to an electronic control unit.

BACKGROUND OF THE INVENTION

Recently, a vehicle-mounted motor and an electronic control unit for driving the motor are increasing. On the other hand, in order to extend vehicle interior space, the space for arranging the motor and the electronic control unit is decreased. Therefore, size reduction of the motor and the electronic control unit is desired.

Japanese Patent No. 2684893 B2 discloses a hybrid integrated circuit, a size of which is reduced by arranging transistors on both surfaces of a circuit board.

For example, an electronic control unit for driving a motor of an electronic power steering system (hereinafter referred to as EPS) that assists steering by a driver is energized by large current, and thus, its heating value becomes large. The electronic control unit for the EPS is placed in an engine room or a narrow space behind an instrument panel. If the electronic control unit is configured as described in Japanese Patent No. 2684893 B2, thermal interference is generated between electronic components (hereinafter referred to as heat generating components) that generate heat with the energization. Therefore, it may become difficult to apply large current.

SUMMARY OF THE INVENTION

In view of the above-described points, it is an object of the present invention to provide an electronic control unit, a size of which can be reduced by limiting thermal interference between heat generating components.

According to one aspect of the present invention, an electronic control unit includes a circuit board; a plurality of circuit patterns, which are formed on the circuit board; a plurality of semiconductor devices, each of which is installed to a corresponding one of the plurality of circuit patterns; a plurality of leads, each of which electrically and mechanically connects between the corresponding one of the plurality of circuit patterns and a corresponding one of the plurality of semiconductor devices; and at least one thermal-conduction limiting portion, which is placed between corresponding two of the plurality of circuit patterns and is adapted to limit conduction of heat, which is generated from at least one of the plurality of semiconductor devices upon operation thereof, between the corresponding two of the plurality of circuit patterns.

Accordingly, thermal interference between the semiconductor devices can be limited by reducing thermal conduction between the circuit patterns. Therefore, by forming the semiconductor devices as heat generating components to be arranged adjacently to each other, a size of the electronic control unit can be reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
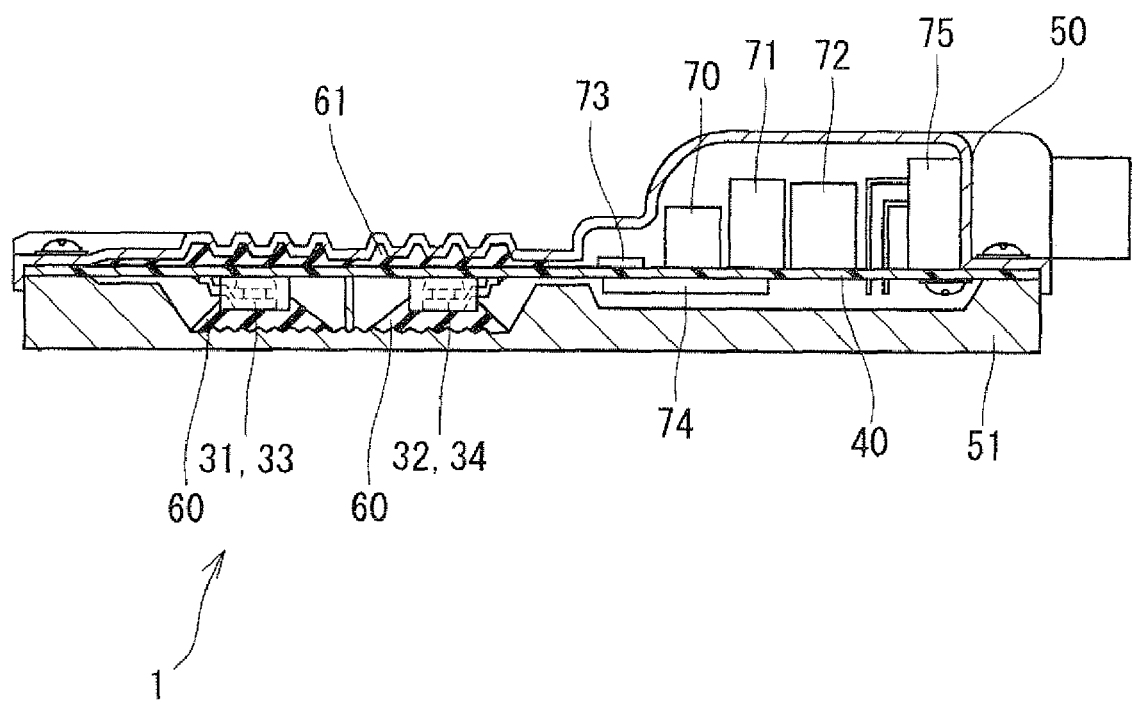
FIG. 1 is a cross-sectional view showing an electronic control unit according to a first embodiment of the present invention.

Hereinafter, embodiments of the present invention will be described with reference to drawings. Similar components in the following embodiments are indicated by the same reference numeral, and descriptions thereof will not be repeated.

First Embodiment

An electronic control unit of the first embodiment is used for an EPS of a vehicle, for example, and controls driving of a motor that generates assist force of steering based on a steering torque signal and a vehicle speed signal.

As shown in FIG. 1, an electronic control unit 1 includes a circuit board 40, an upper case 50 and a lower case 51. Electronic components, such as power MOSFETs (hereinafter referred to as MOSS) 31 to 34, are installed to the circuit board 40. The MOSs 31 to 34 serve as semiconductor devices.

The circuit board 40 is an FR-4 printed wiring board made of glass woven fabric and epoxy resin, for example. Other than the MOSs 31 to 34, an aluminum electrolytic capacitor 70, a coil 71, a relay 72, a shunt resistance 73, a microcomputer (hereinafter referred to as IC) 74 and the like are installed to the circuit board 40. Moreover, a connector 75 is connected to the circuit board 40.

The MOSs 31 to 34 switch current supplied from a battery via the connector 75. Based on a steering torque signal and a vehicle speed signal which are input via the connector 75, the IC 74 detects a rotating direction and rotating torque of the motor and outputs a signal from a driver so that switching of the MOSs 31 to 34 is controlled. Furthermore, the IC 74 monitors a temperature of heat generated from the MOSs 31 to 34.

The aluminum electrolytic capacitor 70 assists the power supply to the MOSs 31 to 34 by storing charge, and absorbs the ripple voltage generated by switching of the MOSs 31 to 34. The coil 71 reduces power-supply noise. The relay 72 has a fail-safe function.

A space between the MOSs 31 to 34 and the lower case 51 is filled with a heat releasing gel 60, and a space between the circuit board 40 and the upper case 50 is filled with a heat releasing gel 61. The heat releasing gels 60, 61 are made of silicone-based material, for example.

Each of the upper case 50 and the lower case 51 is formed to have an irregular surface so that movement of the heat releasing gels 60, 61 is limited. Since a surface area is increased by forming the irregular surface, heat releasing performance is improved. Moreover, the movement of the heat releasing gels 60, 61 may be limited by performing a roughening process on the surface of each of the upper case 50 and the lower case 51.

The MOSs 31 to 34 and the IC 74 are placed on a surface of the circuit board 40, and the aluminum electrolytic capacitor 70, the coil 71, the relay 72, the shunt resistance 73 and the connector 75 are placed on a rear surface of the circuit board 40. For the sake of convenience, the surface (i.e., first surface) of the circuit board 40 and the rear surface (i.e., second surface) of the circuit board 40 are used in order to distinguish one surface of a circuit board from the other surface of the circuit board.

Figure 2A:
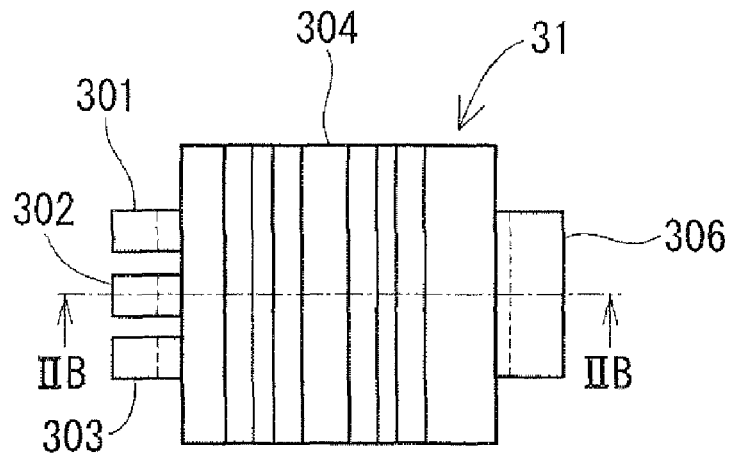
FIG. 2A is a plan view showing a semiconductor device used for the electronic control unit according to the first embodiment of the present invention.
Figure 2B:
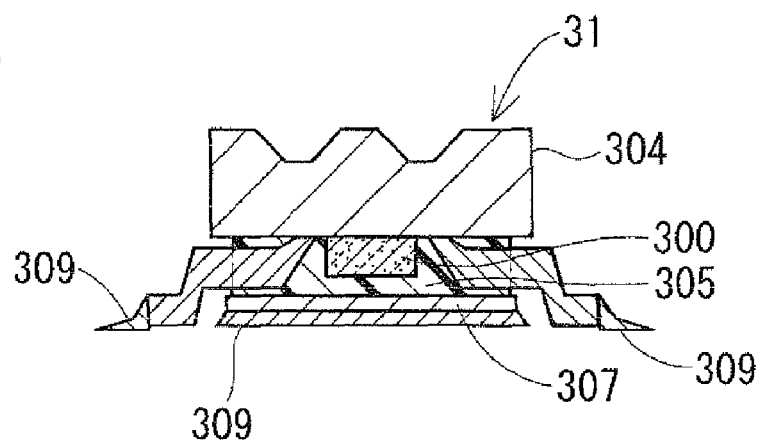
FIG. 2B is a cross-sectional view showing the semiconductor device taken along the line IIB-IIB of FIG. 2A.
Figure 2C:
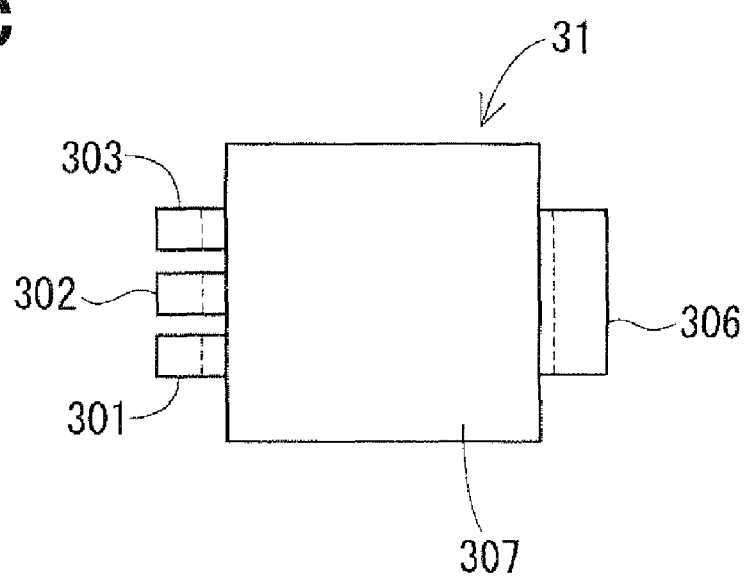
FIG. 2C is a bottom view showing the semiconductor device.

As shown in FIGS. 2A to 2C, the MOS 31 includes a semiconductor chip 300, multiple leads 301, 302, 303, a heat releasing plate 304, a mold resin 305, a side-surface heat releasing plate 306, a metal base 307 and the like. The three leads 301, 302, 303 are connected to a drain, a gate, a source of the semiconductor chip 300, respectively. Hereinafter, the lead 301 for the drain, the lead 302 for the gate, the lead 303 for the source are referred to as a drain lead 301, a gate lead 302, a source lead 303, respectively. The heat releasing plate 304 is made of metal, and is connected to the drain lead 301 or the source lead 303. This is because heating values of the drain lead 301 and the source lead 303 become large when the semiconductor chip 300 is energized. The side-surface heat releasing plate 306 and the metal base 307 are also made of metal, and are connected to the drain lead 301 or the source lead 303. The mold resin 305 molds the semiconductor chip 300, the leads 301, 302, 303, the heat releasing plate 304, the side-surface heat releasing plate 306 and the metal base 307 with resin. The leads 301, 302, 303, the side-surface heat releasing plate 306 and the metal base 307 are installed to a circuit pattern of the circuit board 40 with a solder 309.

Figure 3:
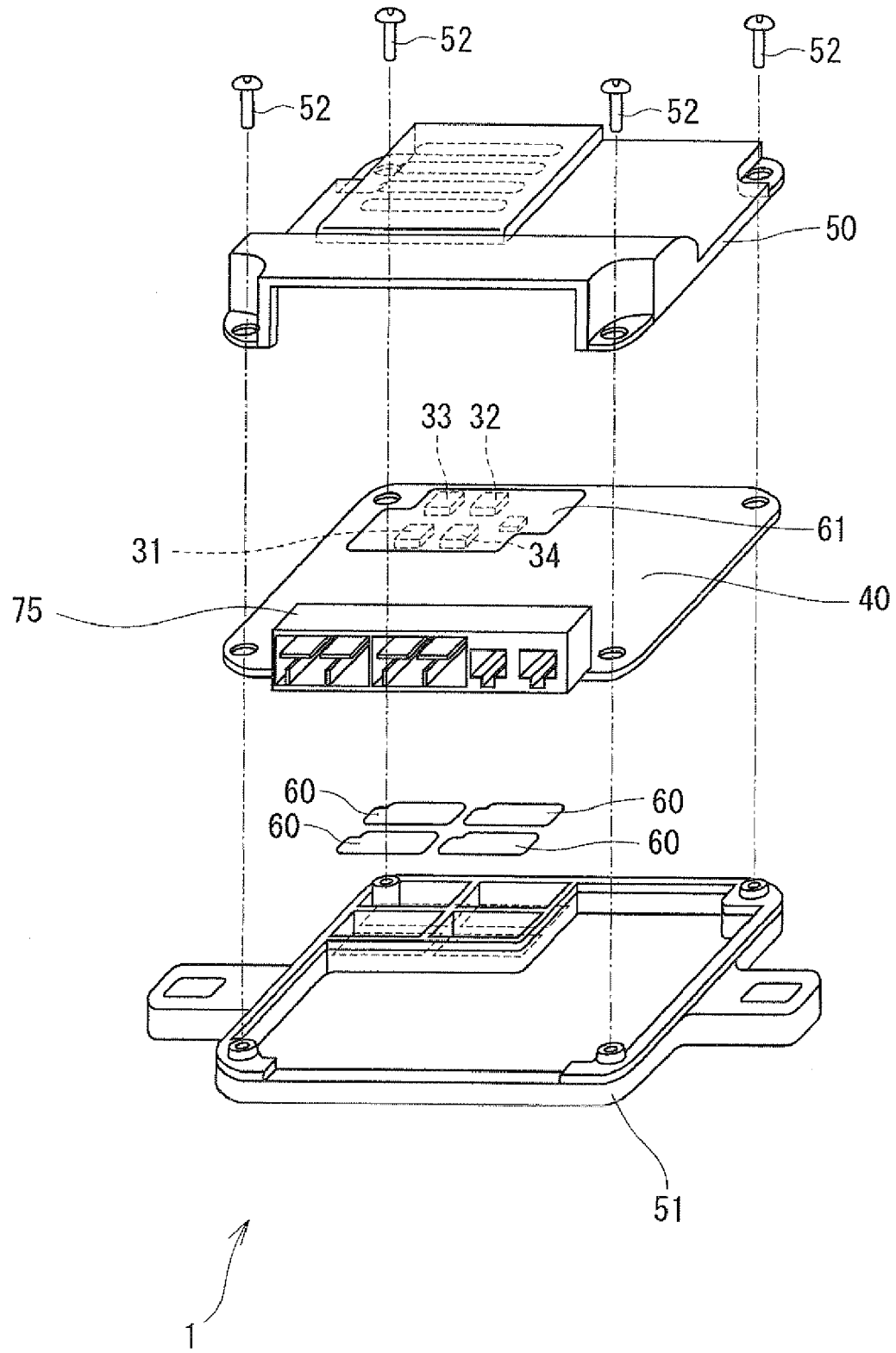
FIG. 3 is an exploded perspective view showing an assembly structure of the electronic control unit according to the first embodiment of the present invention.

As shown in FIG. 3 showing an assembly structure of the electronic control unit 1, the heat releasing gel 60 is placed between the MOSs 31 to 34 and the lower case 51, and the heat releasing gel 61 is placed between the circuit board 40 and the upper case 50. The upper case 50, the circuit board 40, and the lower case 51 are fixed to one another with four screws 52. Each of the upper case 50 and the lower case 51 is formed to have the irregular surface so that the distortion of the circuit board 40 can be limited, and therefore, a screw for fixing the center of the circuit board 40 becomes unnecessary.

Figure 4:
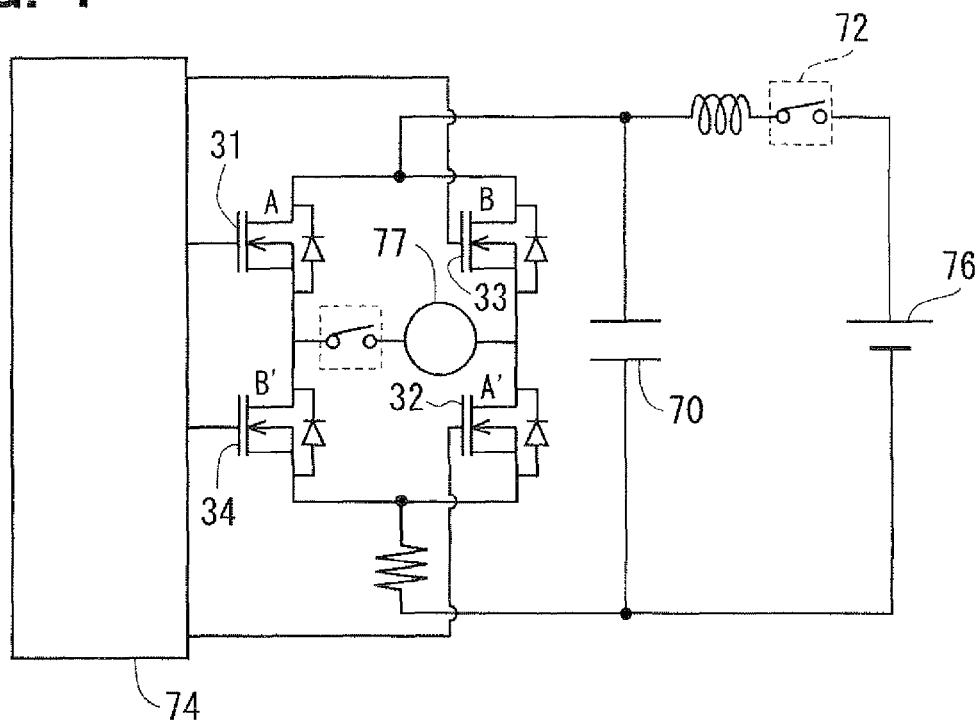
FIG. 4 is a circuit diagram showing the electronic control unit according to the first embodiment of the present invention.

As shown in FIG. 4, the four MOSs 31 to 34 constitute an H-bridge circuit with a motor 77 and the like. Hereinafter, the MOSs 31 to 34 are also referred to as A_MOS 31, A'_MOS 32, B_MOS 33, B'_MOS 34, respectively for the sake of convenience. When a steering wheel is turned to the right, the A_MOS 31 and the A'_MOS 32 are turned on and the B_MOS 33 and the B'_MOS 34 are turned off so that the motor 77 is driven. When the steering wheel is turned to the left, the A_MOS 31 and the A'_MOS 32 are turned off and the B_MOS 33 and the B'_MOS 34 are turned on so that the motor 77 is driven.

When the steering wheel is turned from right to left, the A'_MOS 32 is turned off before the A_MOS 31 is turned off, and thereby current flows to the A_MOS 31 and the B_MOS 33.

In contrast, when the steering wheel is turned from left to right, the B'_MOS 34 is turned off before the B_MOS 33 is turned off, and thereby current flows to the B_MOS 33 and the A_MOS 31. Thus, the heating values of the A_MOS 31 and the B_MOS 33 are larger than those of the A'_MOS 32 and the B'_MOS 34.

Figure 5:
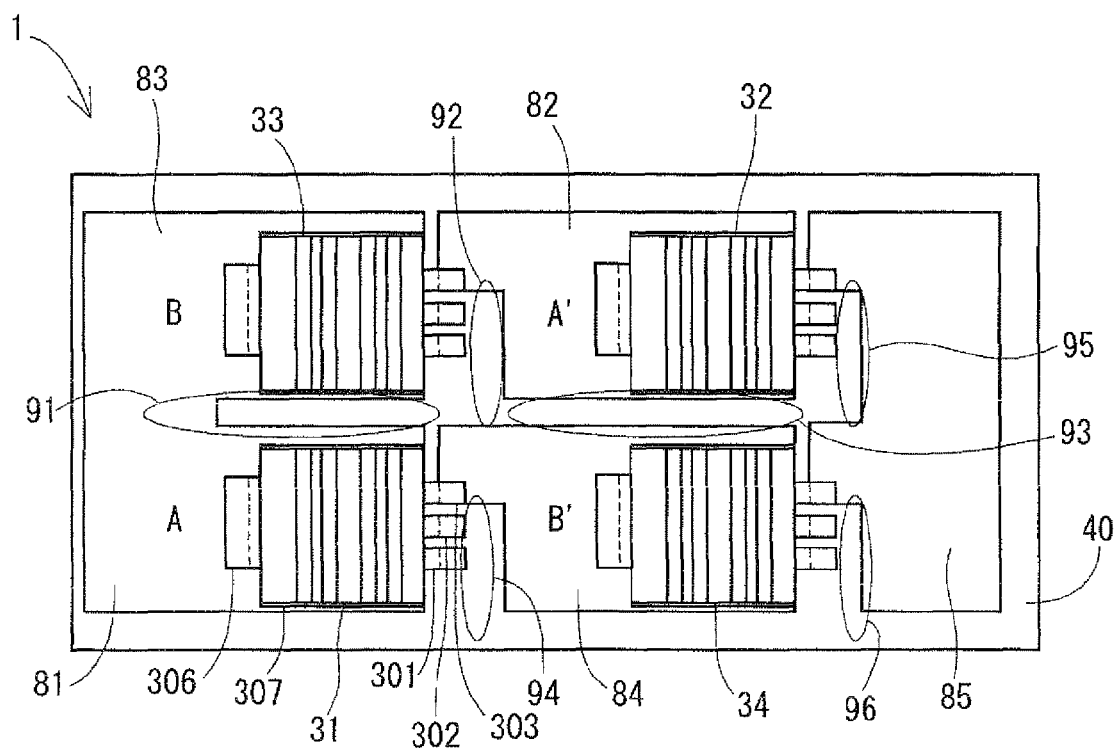
FIG. 5 is a plan view showing a main part of the electronic control unit according to the first embodiment of the present invention.

As shown in FIG. 5, multiple circuit patterns 81 to 85 are formed on the surface of the circuit board 40. Each of the circuit patterns 81 to 85 is made of copper foil, and has an enough area in which large current flows. Multiple inner layer patterns (not shown) may be formed in the circuit board 40, and may be connected to the circuit patterns 81 to 85 by through holes (not shown).

The A_MOS 31 and the B_MOS 33 are placed on the circuit patterns 81, 83. The circuit pattern 81, on which the A_MOS 31 is placed, is formed integrally with the circuit pattern 83, on which the B_MOS 33 is placed.

The drain lead 301 of the A_MOS 31 is connected to a part of the circuit pattern 81 by soldering. Moreover, the side-surface heat releasing plate 306 and the metal base 307 of the A_MOS 31 are also connected to the circuit pattern 81 by soldering. In the A_MOS 31, electric potentials of the drain lead 301, the side-surface heat releasing plate 306 and the metal base 307 are equalized.

The source lead 303 of the A_MOS 31 is connected to the circuit pattern 84, on which the B'_MOS 34 is placed, by soldering. The gate lead 302 of the A_MOS 31 is connected to a land (not shown), which is connected to the IC 74, by soldering.

As with the A_MOS 31, in each of the MOSs 32 to 34, a drain lead, a side-surface heat releasing plate and a metal base are connected to the corresponding circuit pattern, on which the MOS is placed, and a source lead is connected to the adjacent circuit pattern.

The A_MOS 31 and the A'_MOS 32, which are energized simultaneously when the steering wheel is turned to the right, are placed obliquely so that the distance between the MOS 31 and the MOS 32 is extended. Moreover, the B_MOS 33 and the B'_MOS 34, which are energized simultaneously when the steering wheel is turned to the left, are placed obliquely so that the distance between the MOS 33 and the MOS 34 is extended. Thus, the thermal interference between the MOSs which are energized simultaneously can be limited.

A first thermal-conduction limiting portion 91 is formed between the circuit pattern 81, on which the A_MOS 31 is placed, and the circuit pattern 83, on which the B_MOS 33 is placed. A second thermal-conduction limiting portion 92 is formed between the drain lead of the B_MOS 33 and the circuit pattern 82, on which the A'_MOS 32 is placed. A third thermal-conduction limiting portion 93 is formed between the circuit pattern 82, on which the A'_MOS 32 is placed, and the circuit pattern 84, on which the B'_MOS 34 is placed. A fourth thermal-conduction limiting portion 94 is formed between the circuit pattern 84, on which the B'_MOS 34 is placed, and the drain lead of the A_MOS 31. A fifth thermal-conduction limiting portion 95 is formed between the circuit pattern 85, to which the source lead of the A'_MOS 32 and the source lead of the B'_MOS 34 are connected, and the drain lead of the A'_MOS 32. A sixth thermal-conduction limiting portion 96 is formed between the circuit pattern 85 and the drain lead of the B'_MOS 34.

The first to sixth thermal-conduction limiting portions 91 to 96 are made of resin configuring the circuit board. A width of each of the first to sixth thermal-conduction limiting portions 91 to 96 is set based on current used in the electronic control unit 1. The circuit patterns 81 to 85 are not formed on places in which the thermal-conduction limiting portions 91 to 96 are formed. Since thermal resistance of the resin configuring the circuit board is large, thermal conduction between the adjacent circuit patterns in the circuit patterns 81 to 85 is reduced. Thus, the thermal interference between the MOSs 31 to 34 can be limited.

Figure 33:
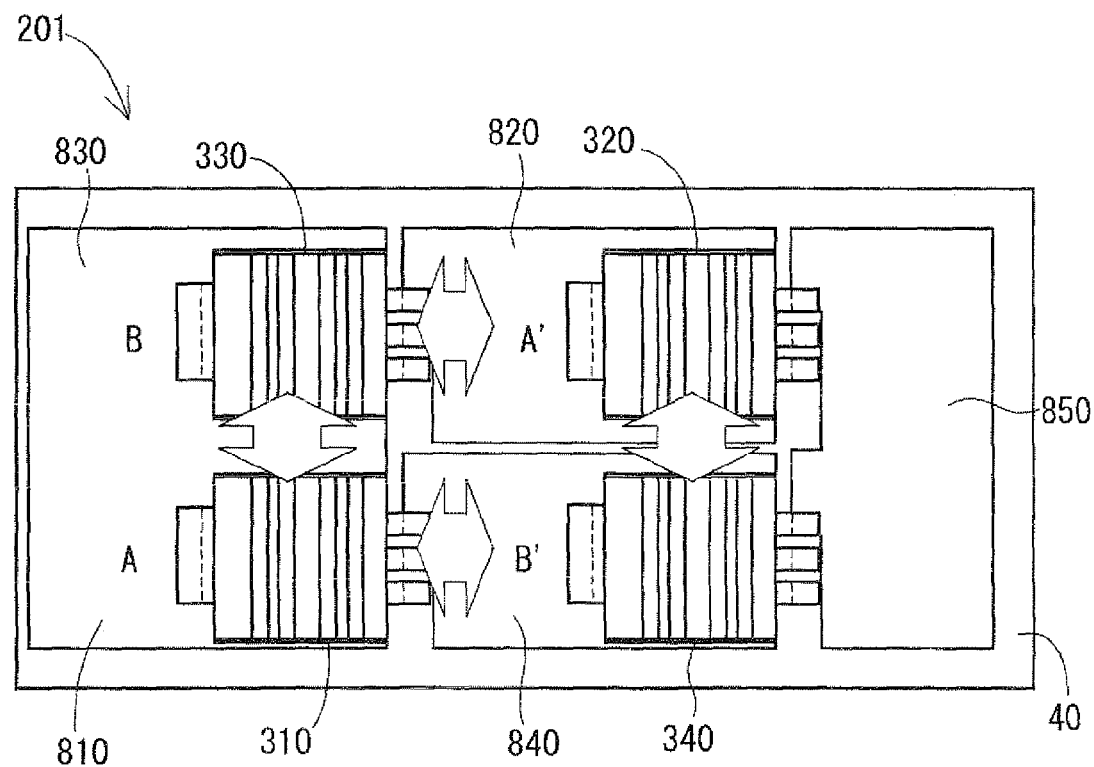
FIG. 33 is a plan view showing a main part of an electronic control unit according to a first comparative example of the present invention.

An electronic control unit 201 of a first comparative example is shown in FIG. 33. In the first comparative example, multiple circuit patterns 810, 820, 830, 840, 850 are formed on the surface of the circuit board 40. An A_MOS 310 and a B_MOS 330 are placed on the circuit patterns 810, 830, which are integrally formed. An A'_MOS 320 is placed on the circuit pattern 820, and a B'_MOS 340 is placed on the circuit pattern 840.

Drain leads of the MOSs 310, 320, 330, 340 are connected respectively to the circuit patterns 810, 820, 830, 840, which are located respectively below the MOSs 310, 320, 330, 340. Source leads of the MOSs 310, 320, 330, 340 are connected respectively to the adjacent circuit patterns 840, 850, 820, 850.

The circuit patterns 810, 820, 830, 840 are located adjacently to each other so as to be electrically insulated from each other, thereby decreasing the thermal resistance. Moreover, each of the drain leads of the MOSs 310, 320, 330, 340 and each of the corresponding circuit patterns 840, 850, 820, 850 are located adjacently to each other so as to be electrically insulated from each other, thereby decreasing the thermal resistance.

In the present embodiment, the first thermal-conduction limiting portion 91 is formed between the circuit pattern 81, on which the A_MOS 31 is placed, and the circuit pattern 83, on which the B_MOS 33 is placed. The third thermal-conduction limiting portion 93 is formed between the circuit pattern 82, on which the A'_MOS 32 is placed, and the circuit pattern 84, on which the B'_MOS 34 is placed.

The fourth thermal-conduction limiting portion 94 is formed between the drain lead of the A_MOS 31 and the circuit pattern 84, on which the B'_MOS 34 is placed. The second thermal-conduction limiting portion 92 is formed between the drain lead of the B_MOS 33 and the circuit pattern 82, on which the A'_MOS 32 is placed. Since the thermal resistance of the thermal-conduction limiting portions 91 to 94 made of resin configuring the circuit board is large, the thermal interference between the MOSs 31 to 34 can be limited. Therefore, the electronic control unit 1 of the present embodiment can cope with the large current. Furthermore, by forming the MOSs 31 to 34 to be arranged adjacently to each other, a size of the electronic control unit 1 can be reduced.

Second Embodiment

Figure 6:
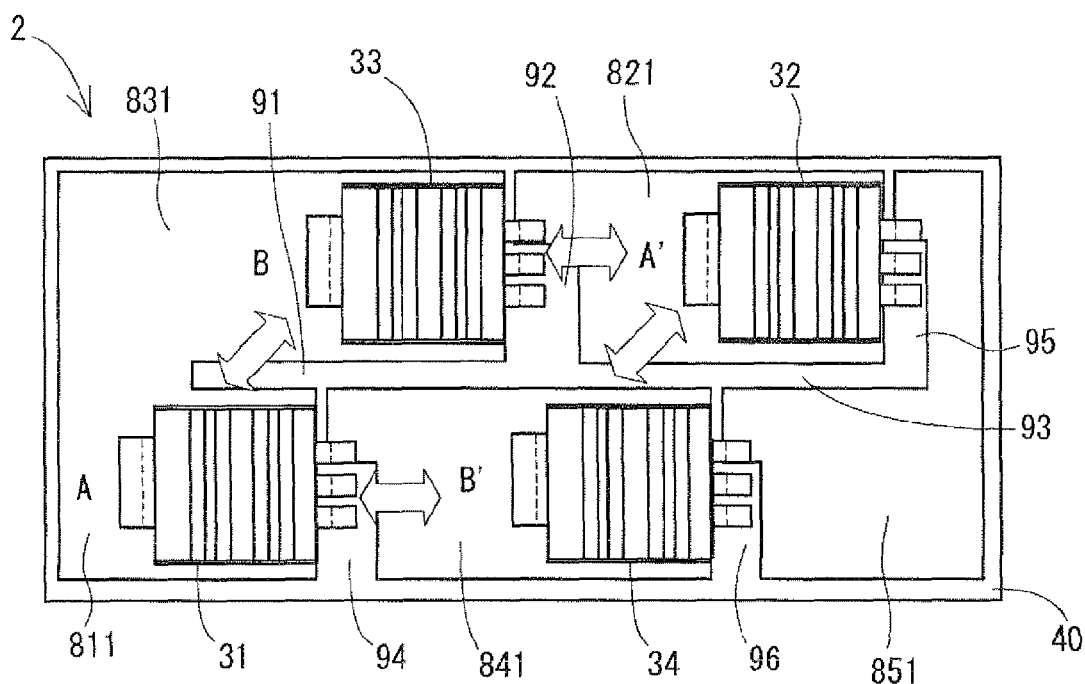
FIG. 6 is a plan view showing a main part of an electronic control unit according to a second embodiment of the present invention.

As shown in FIG. 6, multiple circuit patterns 811, 821, 831, 841, 851 are formed on the surface of the circuit board 40. In an electronic control unit 2 of the present embodiment, the distance between the A_MOS 31 and the left end of the circuit board 40 is shorter than the distance between the B_MOS 33 and the left end of the circuit board 40. Furthermore, the distance between the A'_MOS 32 and the right end of the circuit board 40 is shorter than the distance between the B'_MOS 34 and the right end of the circuit board 40. The distance between the A_MOS 31 and the B'_MOS 34 is substantially the same with the distance between the B_MOS 33 and the A'_MOS 32. Thus, the four MOSs 31 to 34 are placed in a diamond shape. For this reason, the surface area of the circuit patterns 811, 831, on which the A_MOS 31 and the B_MOS 33 are placed, becomes large. Therefore, heat releasing performance of the A_MOS 31 and the B_MOS 33 can be improved, and the thermal interference can be limited.

Moreover, in the present embodiment, the A_MOS 31 and the A'_MOS 32, which are energized simultaneously, are placed obliquely, and the B_MOS 33 and the B'_MOS 34, which are energized simultaneously, are placed obliquely. The MOSs which generate heat at the same time are kept away from each other, and thereby the thermal interference between the MOSs can be limited.

Third Embodiment

Figure 7:
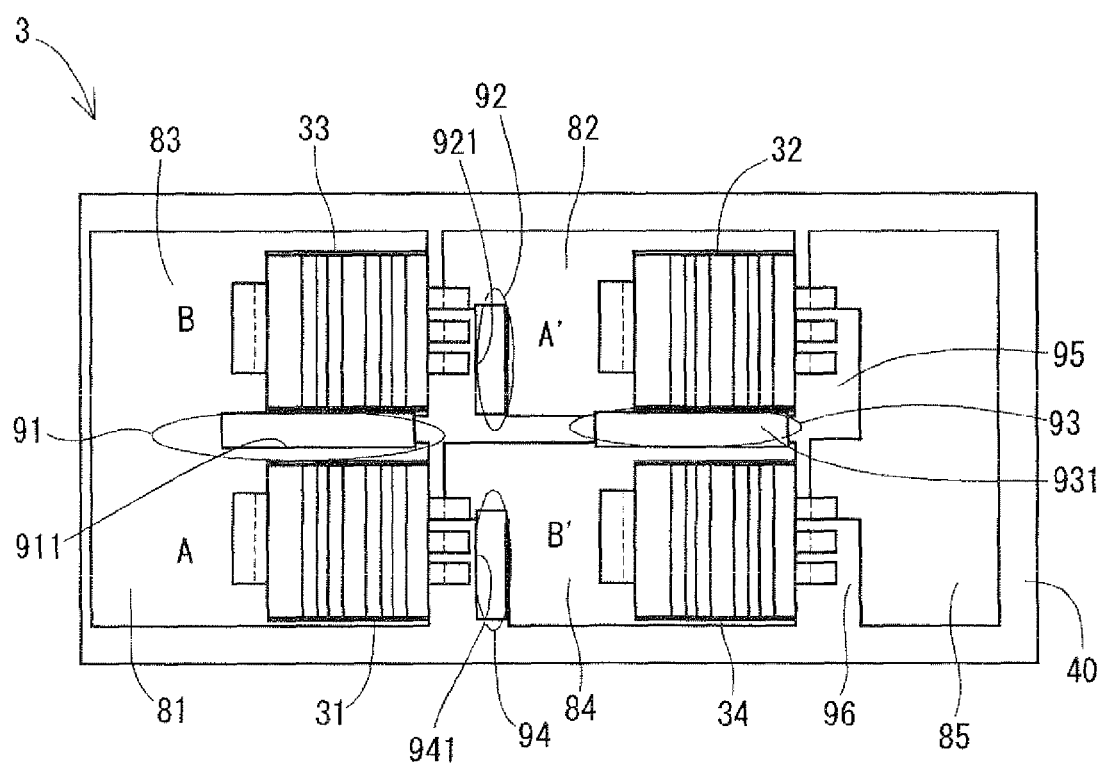
FIG. 7 is a plan view showing a main part of an electronic control unit according to a third embodiment of the present invention.

As shown in FIG. 7, in an electronic control unit 3 of the present embodiment, the first to fourth thermal-conduction limiting portions 91 to 94 have groove portions 911, 921, 931, 941 which are dented in a thickness direction of the circuit board 40. The groove portions 911, 921, 931, 941 are formed to have depths such that each of the groove portions 911, 921, 931, 941 can be separated from an inner layer pattern (not shown). Alternatively, the groove portions 911, 921, 931, 941 may be formed to penetrate the circuit board 40 from the surface thereof to the rear surface thereof.

Since the thermal resistance of air in the groove portions 911, 921, 931, 941 is large, the thermal conduction between the circuit patterns 81 to 84 is decreased. Thus, in the electronic control unit 3 of the present embodiment, the thermal interference between the MOSs 31 to 34 can be limited reliably.

Fourth Embodiment

Figure 8:
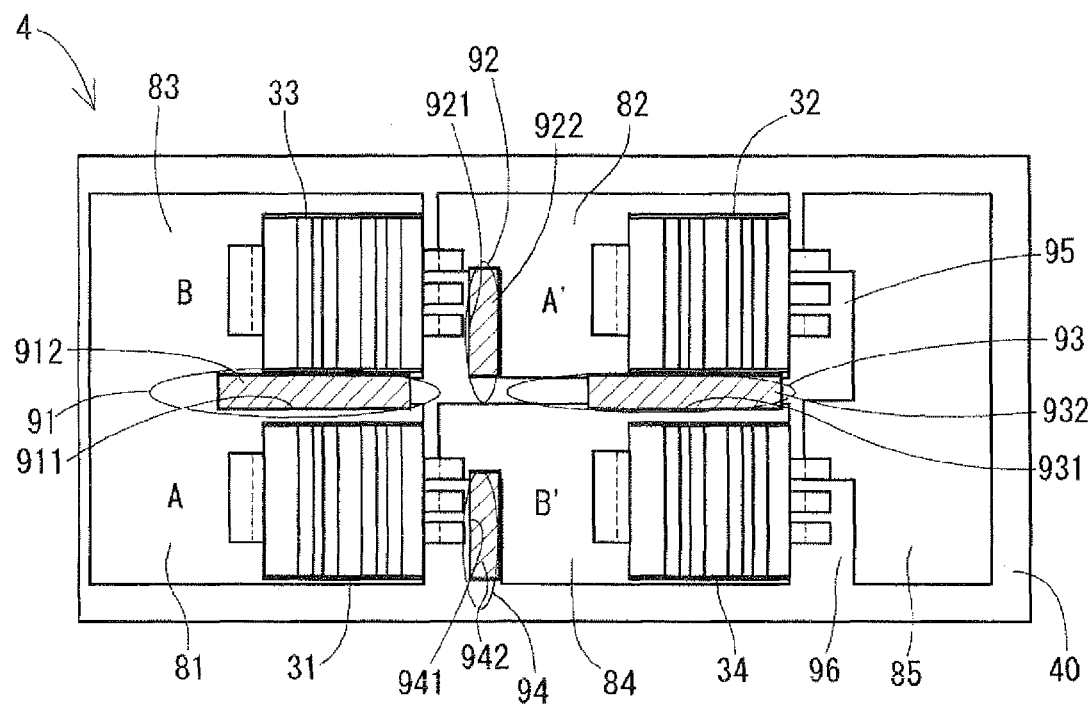
FIG. 8 is a plan view showing a main part of an electronic control unit according to a fourth embodiment of the present invention.

As shown in FIG. 8, in an electronic control unit 4 of the present embodiment, the first to fourth thermal-conduction limiting portions 91 to 94 have first low thermal-conductive layers 912, 922, 932, 942 having low thermal conductivity in each of the groove portions 911, 921, 931, 941.

Fiber insulation such as glass wool, rock wool, sheep wool insulation and cellulose insulation is used for the first low thermal-conductive layers 912, 922, 932, 942. Foam insulation such as urethane foam, phenolic foam, polystyrene foam and expanded polystyrene foam is used for the first low thermal-conductive layers 912, 922, 932, 942. In addition, extruded polystyrene foam, vacuum insulation or the like may be used.

Moreover, resin such as polyphenylene sulfide (PPS), polyphenylene ether (PPE), melamine resin, polycarbonate (PC), polyether sulfone (RES), polysulfone (PSF), polyetherimide, polyimide, polyamide, polyamide-imide (PAI), acrylonitrile styrene resin (AS resin), polypropylene (PP), polyethylene (PE), polymethylpentene (PMP), polyarylate (PAR), polyetheretherketone (PEEK) and polyetherketone (PEK) can be used for the first low thermal-conductive layers 912, 922, 932, 942.

In the present embodiment, the thermal conduction between the circuit patterns 81 to 84 can be reduced, and rigidity of the circuit board 40 can be increased.

Fifth Embodiment

Figure 9:
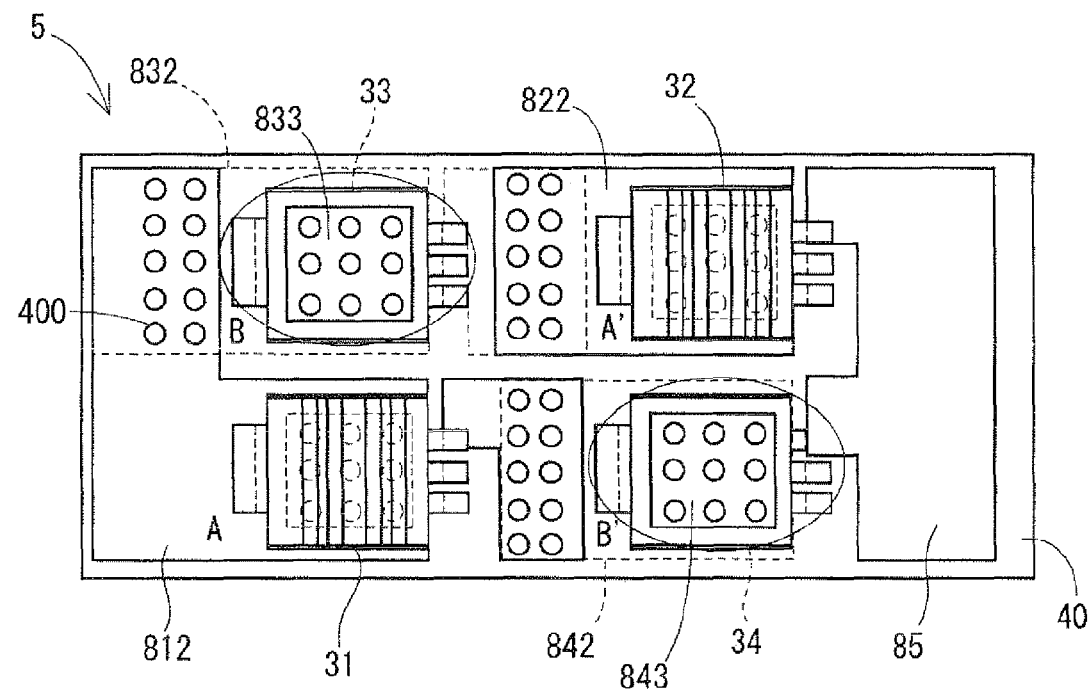
FIG. 9 is a plan view showing a main part of an electronic control unit according to a fifth embodiment of the present invention.

As shown in FIG. 9, in an electronic control unit 5 of the present embodiment, the A_MOS 31 and the A'_MOS 32, which are energized simultaneously when the steering wheel is turned to the right, are installed to each of circuit patterns 812, 822 formed on the surface of the circuit board 40. In contrast, the B_MOS 33 and the B'_MOS 34, which are energized simultaneously when the steering wheel is turned to the left, are installed to each of circuit patterns 832, 842 formed on the rear surface of the circuit board 40. The A_MOS 31 and the A'_MOS 32 are placed obliquely, and the B_MOS 33 and the B'_MOS 34 are placed obliquely.

The B_MOS 33 and the B'_MOS 34 placed on the rear surface of the circuit board 40 are electrically and thermally connected to circuit patterns 833, 843 on the surface of the circuit board 40 via through holes 400. Thus, heat generated from the B_MOS 33 and the B'_MOS 34 is released from the circuit patterns 832, 842 on the rear surface of the circuit board 40 and the circuit patterns 833, 843 on the surface of the circuit board 40.

In the present embodiment, the thermal interference between the A_MOS 31 and the A'_MOS 32, and between the B_MOS 33 and the B'_MOS 34 can be limited, and the heat releasing performance of the MOSs 31 to 34 can be improved.

Sixth Embodiment

Figure 10:
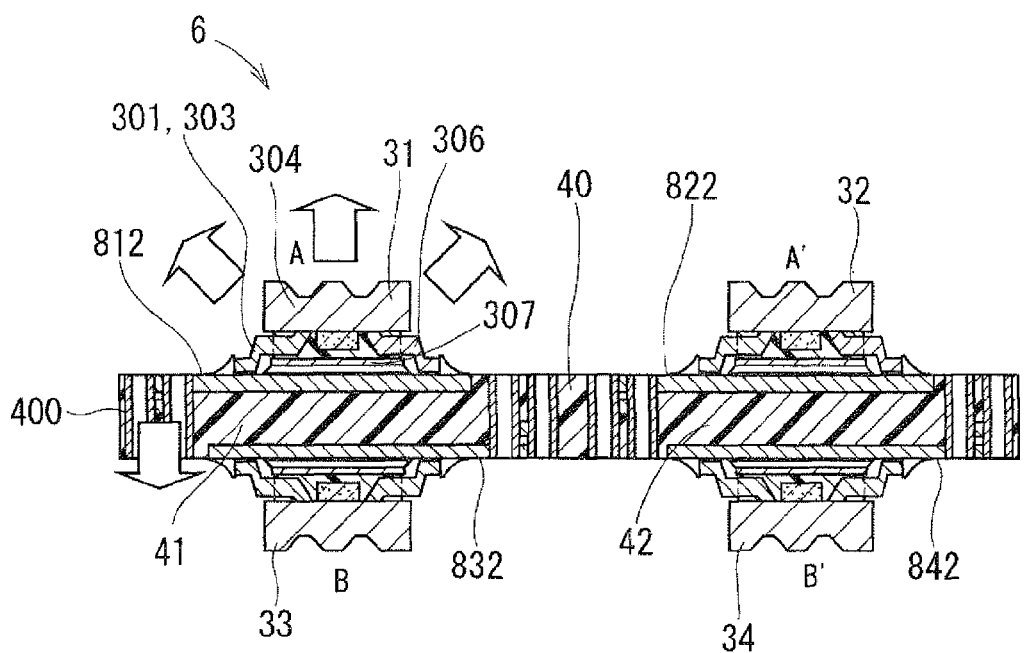
FIG. 10 is a cross-sectional view showing a main part of an electronic control unit according to a sixth embodiment of the present invention.

As shown in FIG. 10, in an electronic control unit 6 of the present embodiment, a thermal conducting path means for conducting heat generated from each of the MOSs 31 to 34 is configured by the circuit patterns 812, 822, 832, 842 and the through holes 400. For example, as shown by the arrows in FIG. 10, heat generated from the MOS 31 is released to the opposite side of the circuit board 40 from the heat releasing plate 304 via the drain lead 301 or the source lead 303. Moreover, the heat generated from the MOS 31 is thermally conducted to the circuit pattern 812 and the through holes 400 and is released to the rear surface of the circuit board 40 via the drain lead 301 or the source lead 303, the side-surface heat releasing plate 306 and the metal base 307.

A seventh thermal-conduction limiting portion 41 is formed between the circuit pattern 812, on which the A_MOS 31 is placed, and the circuit pattern 832, on which the B_MOS 33 is placed. An eighth thermal-conduction limiting portion 42 is formed between the circuit pattern 822, on which the A'_MOS 32 is placed, and the circuit pattern 842, on which the B'_MOS 34 is placed.

The seventh and eighth thermal-conduction limiting portions 41, 42 are made of resin configuring the circuit board. A thickness of each of the seventh and eighth thermal-conduction limiting portions 41, 42 is set based on current used in the electronic control unit 6. Inner layer patterns are not formed in places in which the thermal-conduction limiting portions 41, 42 are formed. Since the thermal resistance of the resin configuring the circuit board is large, the thermal conduction between the circuit patterns 812 and 832, and between the circuit patterns 822 and 842 is reduced. Thus, the thermal interference between the MOSs 31 to 34 can be limited.

Figure 34:
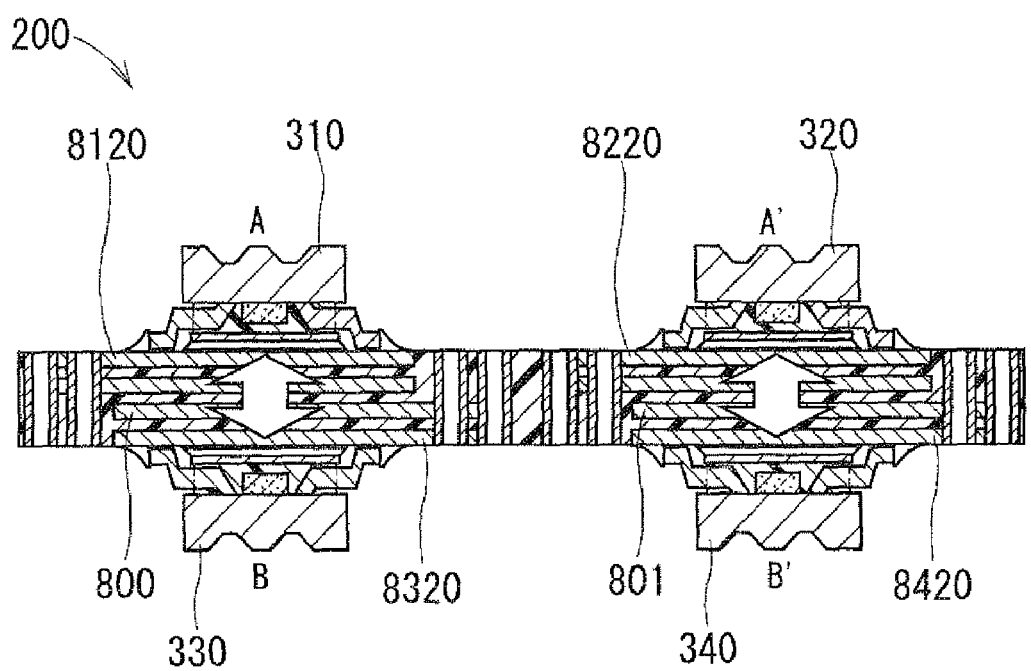
FIG. 34 is a plan view showing a main part of an electronic control unit according to a second comparative example of the present invention.

An electronic control unit 200 of a second comparative example is shown in FIG. 34. In the second comparative example, an inner layer pattern 800 is formed between a circuit pattern 8120, on which the A_MOS 310 is placed, and a circuit pattern 8320, on which the B_MOS 330 is placed. An inner layer pattern 801 is formed between a circuit pattern 8220, on which the A'_MOS 320 is placed, and a circuit pattern 8420, on which the B'_MOS 340 is placed. Thus, the thermal resistance of the circuit board 40 becomes small, and the thermal interference may be generated between the A_MOS 310 and the B_MOS 330, and between the A'_MOS 320 and the B'_MOS 340. Specifically, the heating values of the A_MOS 310 and the B_MOS 330 are large. Therefore, if the thermal interference between the MOS 310 and the MOS 330 is generated, it may become difficult for the electronic control unit 200 to cope with the large current.

In the electronic control unit 6 of the present embodiment, the seventh thermal-conduction limiting portion 41 is formed between the circuit patterns 812, 832, which are formed respectively on the surface of the circuit board 40 and the rear surface of the circuit board 40 and configure the thermal conducting path means. The eighth thermal-conduction limiting portion 42 is formed between the circuit patterns 822, 842, which are formed respectively on the surface of the circuit board 40 and the rear surface of the circuit board 40 and configure the thermal conducting path means. Thus, heat generated from the MOSs 31 to 34 is released with high efficiency by the circuit patterns 812, 832, 822, 842 as the thermal conducting path means, and the thermal interference between the MOSs 31 to 34 can be limited by the seventh and eighth thermal-conduction limiting portions 41, 42. Therefore, the electronic control unit 6 can cope with the large current. Furthermore, by forming the MOSs 31 to 34 to be arranged adjacently to each other, a size of the electronic control unit 6 can be reduced.

Seventh Embodiment

Figure 11:
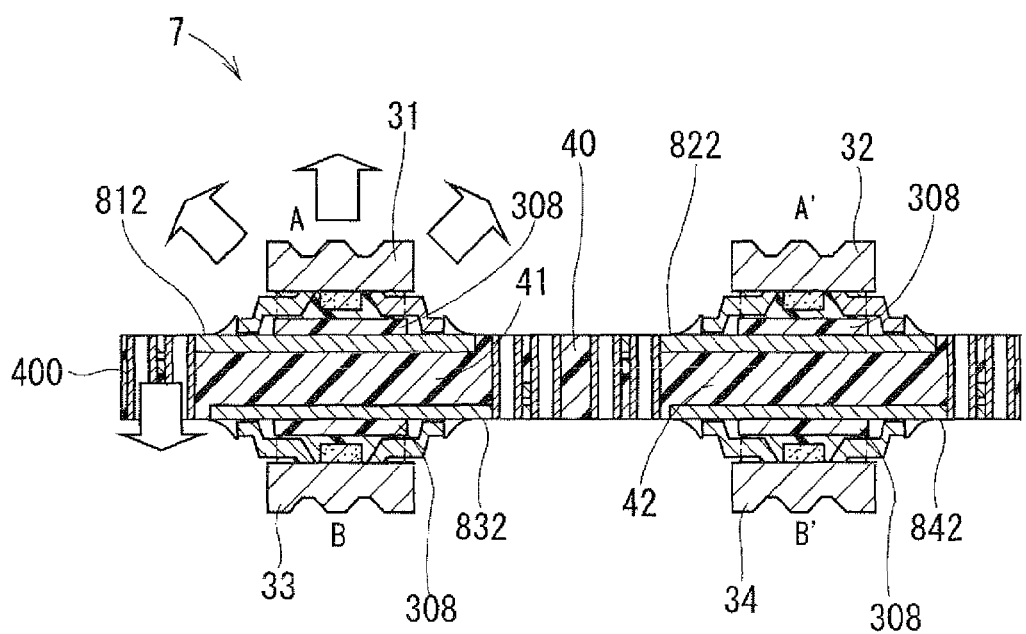
FIG. 11 is a cross-sectional view showing a main part of an electronic control unit according to a seventh embodiment of the present invention.

As shown in FIG. 11, in an electronic control unit 7 of the present embodiment, each of the MOSs 31 to 34 has a low thermal-conductive member 308 having low thermal conductivity at a side of the circuit board 40.

Fiber insulation such as glass wool, rock wool, sheep wool insulation and cellulose insulation is used for the low thermal-conductive member 308. Foam insulation such as urethane foam, phenolic foam, polystyrene foam and expanded polystyrene foam is used for the low thermal-conductive member 308. In addition, extruded polystyrene foam, vacuum insulation or the like may be used.

Moreover, resin such as polyphenylene sulfide (PPS), polyphenylene ether (PPE), melamine resin, polycarbonate (PC), polyether sulfone (PES), polysulfone (PSF), polyetherimide, polyimide, polyamide, polyamide-imide (PAI), acrylonitrile styrene resin (AS resin), polypropylene (PP), polyethylene (PE), polymethylpentene (PMP), polyarylate (PAR), polyetheretherketone (PEEK) and polyetherketone (PEK) can be used for the low thermal-conductive member 308.

In the present embodiment, the thermal interference between the MOSs 31 to 34 can be limited by reducing the thermal conduction between each of the MOSs 31 to 34 and the corresponding circuit pattern in the circuit patterns 812, 822, 832, 842.

Eighth Embodiment

Figure 12:
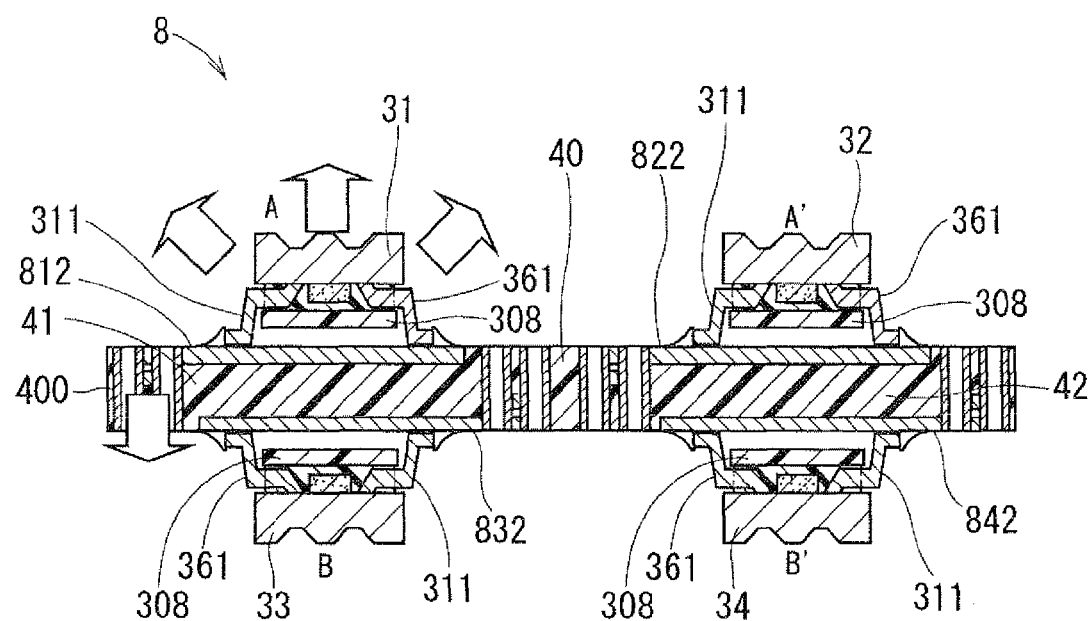
FIG. 12 is a cross-sectional view showing a main part of an electronic control unit according to an eighth embodiment of the present invention.

As shown in FIG. 12, in an electronic control unit 8 of the present embodiment, a lead 311 and a side-surface heat releasing plate 361 of each of the MOSs 31 to 34 extend to be located nearer the circuit board 40 than an end portion of the low thermal-conductive member 308 at the side of the circuit board 40. Thus, space is formed between the circuit board 40 and each of the MOSs 31 to 34. That is, in each of the MOSs 31 to 34, the lead 311 and the side-surface heat releasing plate 361 extend to a location, which is on the side of the corresponding MOS where the circuit board 40 is located, so that the space is defined between the circuit board 40 and the corresponding MOS. Since the thermal resistance of air in the space is large, the thermal conduction between the circuit board 40 and each of the MOSs 31 to 34 is decreased. Furthermore, the low thermal-conductive member 308 suppresses the emitted heat between each of the MOSs 31 to 34 and each of the circuit patterns 812, 822, 832, 842. Thus, the thermal interference between the MOSs 31 to 34 can be limited reliably.

Ninth Embodiment

Figure 13:
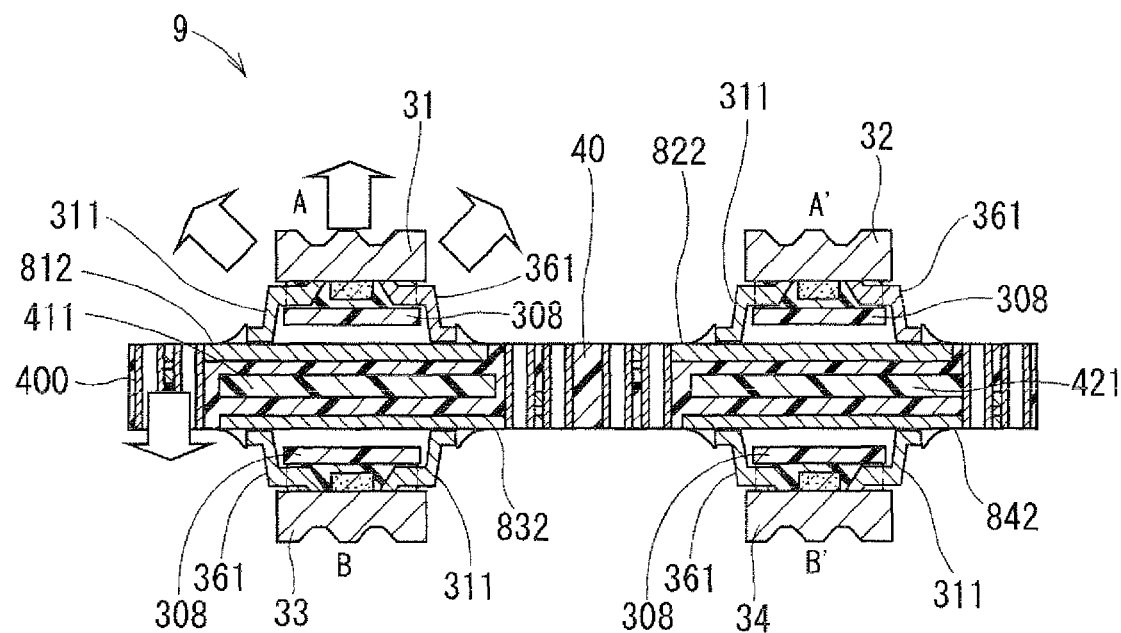
FIG. 13 is a plan view showing a main part of an electronic control unit according to a ninth embodiment of the present invention.

As shown in FIG. 13, in an electronic control unit 9 of the present embodiment, a second low thermal-conductive layer 411 is formed in the circuit board 40 between the circuit pattern 812, on which the A_MOS 31 is placed, and the circuit pattern 832, on which the B_MOS 33 is placed. A second low thermal-conductive layer 421 is formed in the circuit board 40 between the circuit pattern 822, on which the A'_MOS 32 is placed, and the circuit pattern 842, on which the B'_MOS 34 is placed.

The second low thermal-conductive layers 411, 421 are made of the same material with the first low thermal-conductive layers 912, 922, 932, 942 described in the fourth embodiment, and extend along an extending direction of the circuit board 40.

In the present embodiment, the thermal interference between the A_MOS 31 and the B_MOS 33 can be limited by reducing the thermal conduction between the circuit patterns 812, 832 which are formed respectively on the surface of the circuit board 40 and the rear surface of the circuit board 40. The thermal interference between the A'_MOS 32 and the B'_MOS 34 can be limited reliably by reducing the thermal conduction between the circuit patterns 822, 842 which are formed respectively on the surface of the circuit board 40 and the rear surface of the circuit board 40.

Tenth Embodiment

Figure 14:
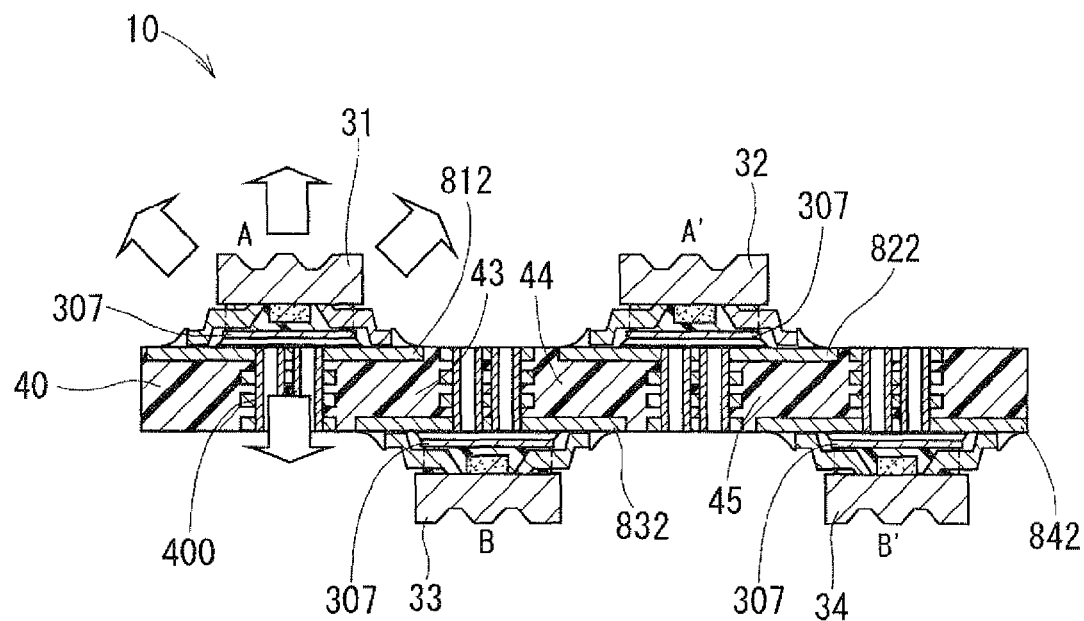
FIG. 14 is a plan view showing a main part of an electronic control unit according to a tenth embodiment of the present invention.

As shown in FIG. 14, in an electronic control unit 10 of the present embodiment, the B_MOS 33 and the B'_MOS 34, which are placed on the rear surface of the circuit board 40, are placed away from each of locations directly below the A_MOS 31 and the A'_MOS 32, which are placed on the surface of the circuit board 40.

The through hole 400 and the inner layer patterns as a thermal conducting path means are formed directly below each of the MOSs 31 to 34. A ninth to eleventh thermal-conduction limiting portions 43, 44, 45 are formed between adjacent through holes 400 which are formed directly below the MOSs 31 to 34. As with the seventh and eighth thermal-conduction limiting portions 41, 42 described in the sixth embodiment, the ninth to eleventh thermal-conduction limiting portions 43, 44, 45 are made of resin configuring the circuit board. The inner layer patterns are not formed in the ninth to eleventh thermal-conduction limiting portions 43, 44, 45. Since the thermal resistance of the resin configuring the circuit board is large, the thermal conduction between the circuit patterns 812, 832, 822, 842 is reduced. Thus, the thermal interference between the MOSs 31 to 34 can be limited.

Furthermore, the heat releasing performance can be improved by forming the thermal conducting path means including the through holes 400 and the inner layer patterns directly below the MOSs 31 to 34.

Eleventh Embodiment

Figure 15:
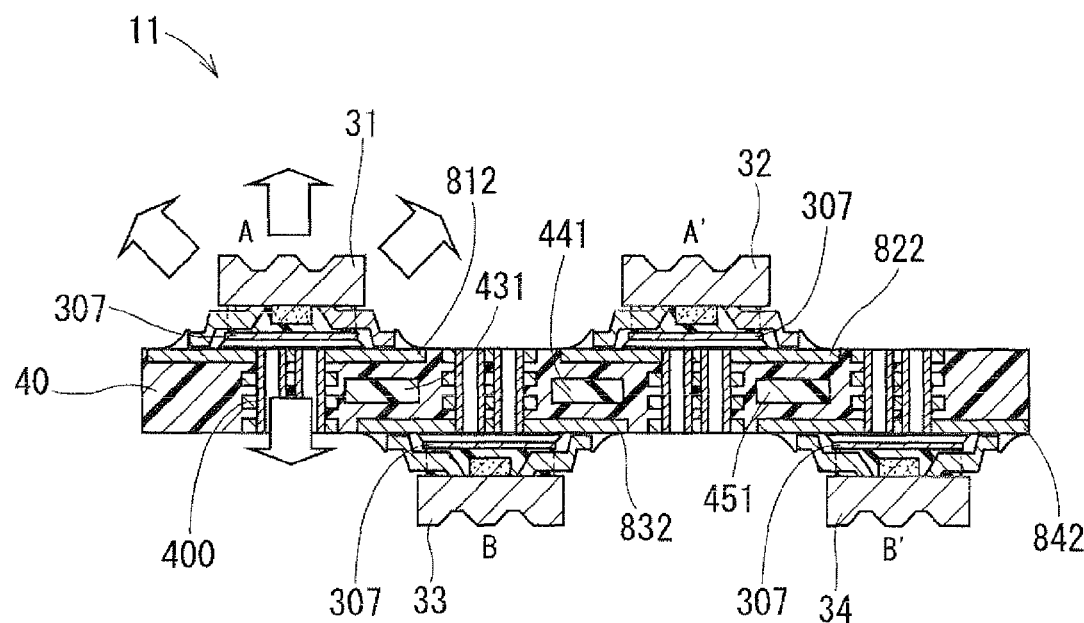
FIG. 15 is a cross-sectional view showing a main part of an electronic control unit according to an eleventh embodiment of the present invention.

As shown in FIG. 15, in an electronic control unit 11 of the eleventh embodiment, second low thermal-conductive layers 431, 441, 451 are formed between the adjacent through holes 400 and the inner layer patterns, which are formed directly below the MOSs 31 to 34. The second low thermal-conductive layers 431, 441, 451 are made of the same material with the first low thermal-conductive layers 912, 922, 932, 942 and the second low thermal-conductive layers 411, 421 described in the fourth and ninth embodiments.

In the present embodiment, the thermal interference between the MOSs 31 to 34 can be limited reliably by reducing the thermal conduction between the circuit patterns 812, 822, 832, 842, which are formed on the surface and the rear surface of the circuit board 40. Furthermore, heat generated from the MOSs 31 to 34 can be released to the opposite side of the circuit board 40 easily by forming the thermal conducting path means directly below the MOSs 31 to 34.

Twelfth Embodiment

Figure 16:
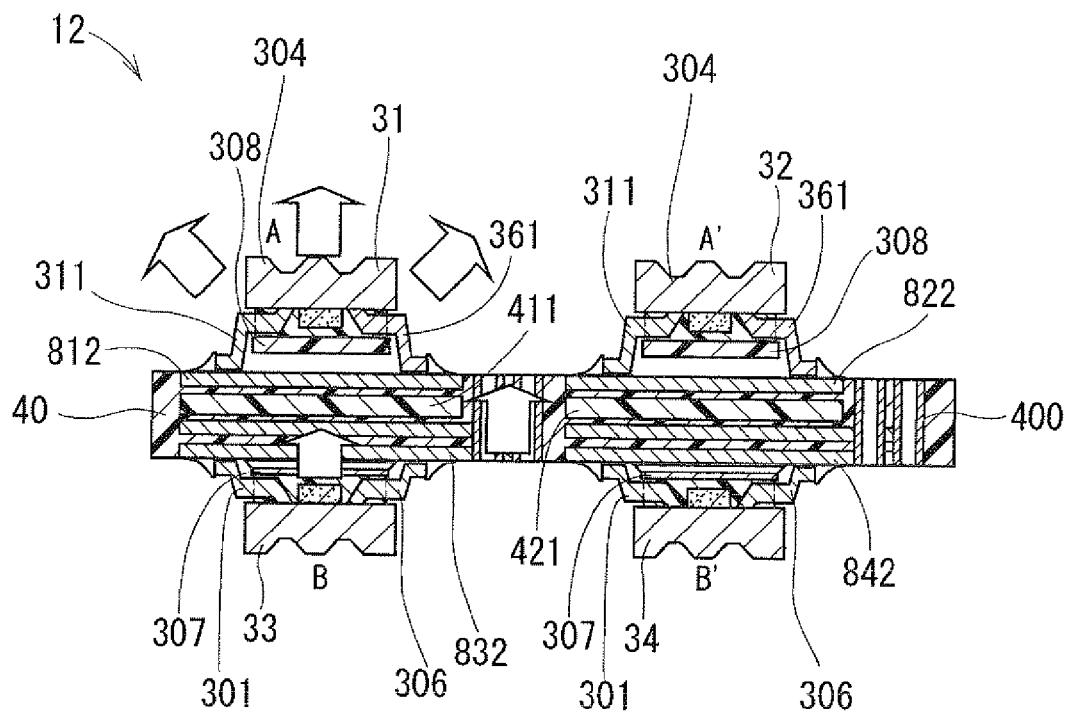
FIG. 16 is a cross-sectional view showing a main part of an electronic control unit according to a twelfth embodiment of the present invention.

As shown in FIG. 16, in an electronic control unit 12 of the twelfth embodiment, heat release quantity to the surface side of the circuit board 40 is larger than heat release quantity to the rear surface side of the circuit board 40.

The A_MOS 31 and the A'_MOS 32 are placed on the surface of the circuit board 40, and the B_MOS 33 and the B'_MOS 34 are placed on the rear surface of the circuit board 40.

The low thermal-conductive member 308 is formed in the A_MOS 31 and the A'_MOS 32 at the side of the circuit board 40. The lead 311 and the side-surface heat releasing plate 361 of each of the A_MOS 31 and the A'_MOS 32 extend to be located nearer the circuit board 40 than the end portion of the low thermal-conductive member 308 at the side of the circuit board 40. Thus, space is formed between the circuit board 40 and each of the A_MOS 31 and the A'_MOS 32. The second low thermal-conductive layer 411 is formed between the circuit pattern 812, on which the A_MOS 31 is placed, and the circuit pattern 832, on which the B_MOS 33 is placed. The second low thermal-conductive layer 421 is formed between the circuit pattern 822, on which the A'_MOS 32 is placed, and the circuit pattern 842, on which the B'_MOS 34 is placed.

Thus, heat generated from the A_MOS 31 and the A'_MOS 32 is released to the opposite side of the circuit board 40 from the heat releasing plate 304.

In contrast, heat generated from the B_MOS 33 and the B'_MOS 34 is released to the surface side of the circuit board 40 from the lead 301, the side-surface heat releasing plate 306 and the metal base 307 via the circuit patterns 832, 842 and the through holes 400.

In the present embodiment, heat is mainly released to an upper case (not shown) arranged at the surface side of the circuit board 40, and a heat releasing gel (not shown) is applied only to the surface side of the circuit board 40. Therefore, the application quantity of the heat releasing gel and the processing cost can be reduced.

Thirteenth Embodiment

Figure 17:
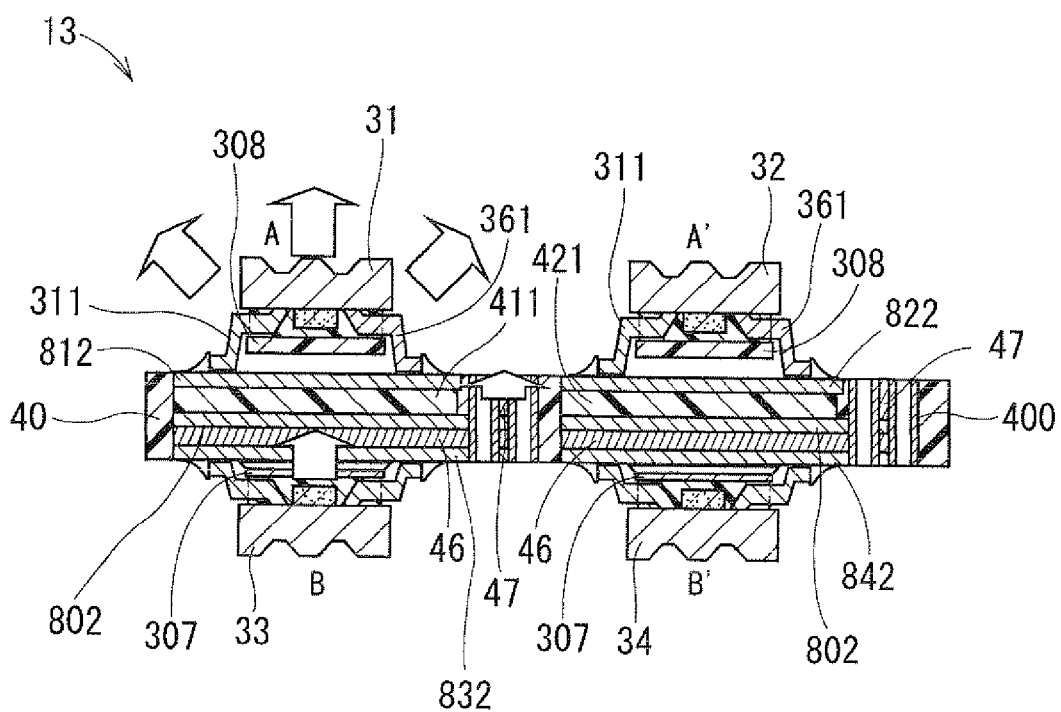
FIG. 17 is a cross-sectional view showing a main part of an electronic control unit according to a thirteenth embodiment of the present invention.

As shown in FIG. 17, in an electronic control unit 13 of the present embodiment, a first high thermal-conductive layer 46 is formed between each of the circuit patterns 832, 842 and an inner layer pattern 802. A second high thermal-conductive layer 47 is formed between the adjacent through holes 400.

The circuit patterns 832, 842, the inner layer pattern 802, the first high thermal-conductive layer 46, the through holes 400 and the second high thermal-conductive layer 47 configure the thermal conducting path means.

Thermosetting resin or high thermal-conductive filler is used for the first high thermal-conductive layer 46 and the second high thermal-conductive layer 47.

Thermosetting resin that is used as resin for sealing a semiconductor device can be used without limitation. An example of thermosetting resin includes epoxy resin, maleimide resin, BT resin, phenol resin, silicone resin. For example, epoxy resin, which has two or more epoxy groups, includes bisphenol type epoxy resin, novolak type epoxy resin, biphenyl type epoxy resin, triphenylmethane type epoxy resin, glycidyl amine type epoxy resin, dicyclopentadiene type epoxy resin or the like.

High thermal-conductive filler that is used as a resin composition for sealing a semiconductor device can be used without limitation. For example, high thermal-conductive filler includes one or more of crystalline silica, beryllium oxide, aluminum oxide, magnesium oxide, diamond, silicon carbide, titanium carbide, silicon nitride, boron nitride, titanium nitride, aluminum nitride, zirconium boride, molybdenum silicide, graphite, boron phosphide, beryllium sulfide and powder of the composite ceramics. In addition, metal powder, for example, plastic-insulated metal powder can be used.

In case of using inorganic filler, it is preferable to include at least one kind of powder selected from $Al_2O_3$, AlN, SiC, $Si_3N_4$, MgO, $SiV_2$, BN as a main component. These materials are excellent in thermal conductivity or an insulating property, and can configure the circuit board with high heat releasing performance.

High thermal-conductive resin can be formed by mixing metal having high thermal conductivity or filler of inorganic ceramics into resin, for example.

As an example of a resin itself having high thermal conductivity includes resin made of 4-(Oxiranylmethoxy)benzoic acid-4,4'-[1,8-octanediylbis(oxy)]bisphenol ester as epoxy resin monomer and 4,4'-Diaminodiphenylmethane as an epoxy resin curing agent.

In the present embodiment, the thermal resistance of the circuit board 40 can be decreased, and the heat releasing performance can be improved. Moreover, by increasing a heat capacity of the thermal conducting path means, heat leakage from the thermal conducting path means can be reduced. Thus, the thermal interference between the MOSs 31 to 34 can be limited.

Fourteenth Embodiment

Figure 18:
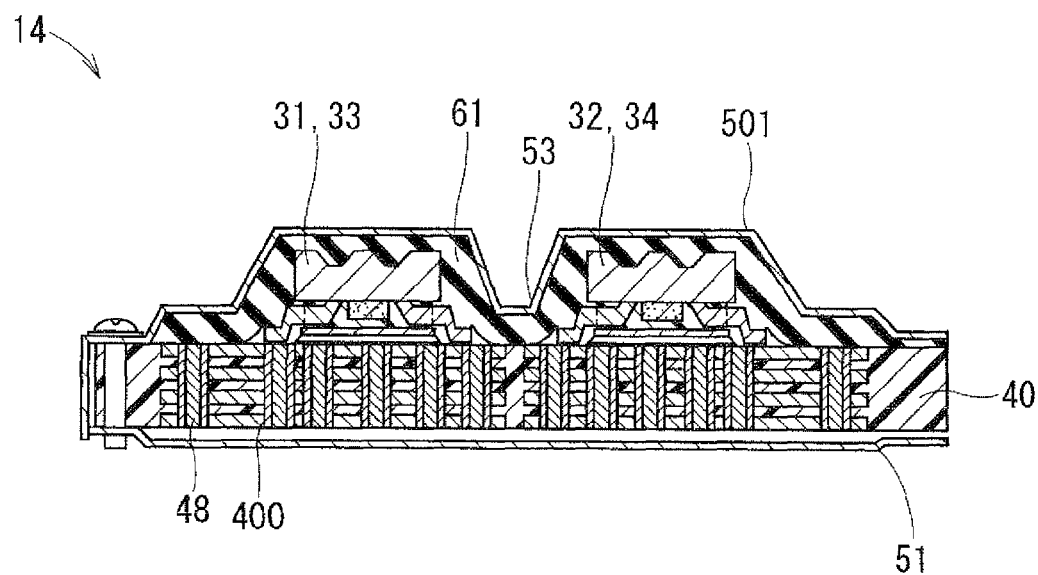
FIG. 18 is a cross-sectional view showing a main part of an electronic control unit according to a fourteenth embodiment of the present invention.

As shown in FIG. 18, in an electronic control unit 14 of the present embodiment, the heat releasing gel 61 is formed between an upper case 501 and the circuit board 40. The heat releasing gel 61 conducts heat generated from the MOSs 31 to 34 to the upper case 501. The heat conducted to the upper case 501 is released into the air or the like.

The upper case 501 is made of an aluminum plate or a galvanized sheet, for example, and has a projection 53 that projects to a side of the circuit board 40 between the MOSs 31, 33 and the MOSs 32, 34. The projection 53 can limit the movement of the heat releasing gel 61. A surface area of the upper case 501 is increased by forming the projection 53, and therefore, the heat releasing performance can be improved. Furthermore, the rigidity of the upper case 501 can be increased by forming the projection 53, and therefore, the distortion of the upper case 501 can be limited.

The through holes 400 are filled with solder 48 which configures the thermal conducting path means together with the inner layer patterns and the circuit patterns. Thus, heat releasing efficiency of the circuit board 40 can be increased, and leakage of the heat releasing gel 61 to the rear surface of the circuit board 40 can be limited. Therefore, cost of the heat releasing gel 61 can be reduced. If a heat generating device such as a motor (not shown) is placed on the rear surface of the circuit board 40, a thermal insulation property can be improved by air between the lower case 51 and the circuit board 40.

Fifteenth Embodiment

Figure 19:
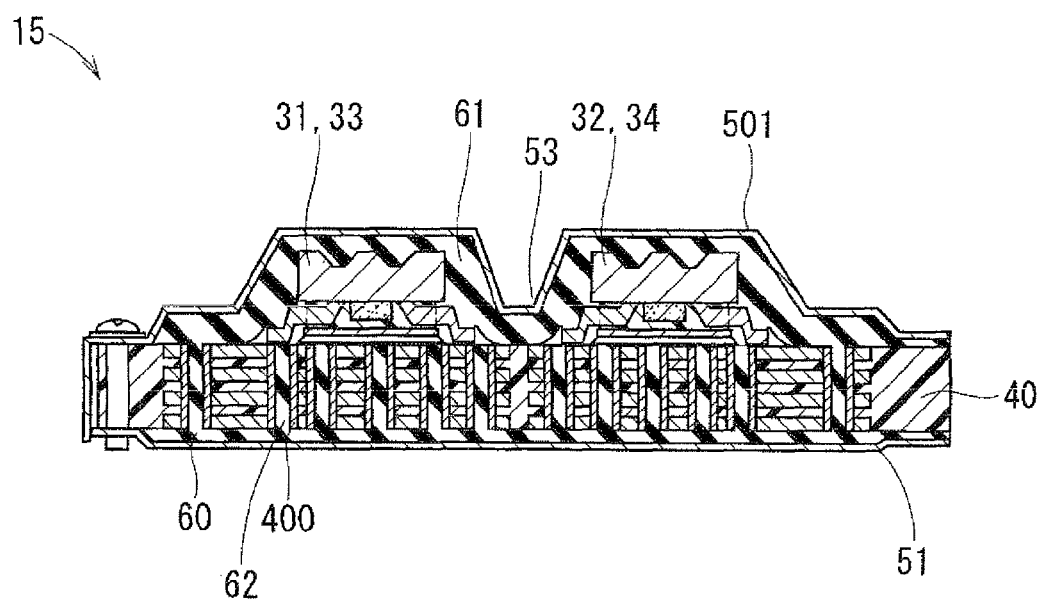
FIG. 19 is a cross-sectional view showing a main part of an electronic control unit according to a fifteenth embodiment of the present invention.

As shown in FIG. 19, in an electronic control unit 15 of the present embodiment, the heat releasing gel 61 is formed between the upper case 501 and the circuit board 40. The heat releasing gel 60 is formed between the lower case 51 and the circuit board 40. Furthermore, the through holes 400 in the circuit board 40 are filled with a heat releasing gel 62.

Thus, heat generated from the MOSs 31 to 34 is conducted to both the upper case 501 and the lower case 51 by the heat releasing gels 60 to 62. The heat conducted to the upper case 501 and the lower case 51 is released into the air or the like. Therefore, in the electronic control unit 15, the heat releasing performance can be improved.

Sixteenth Embodiment

Figure 20:
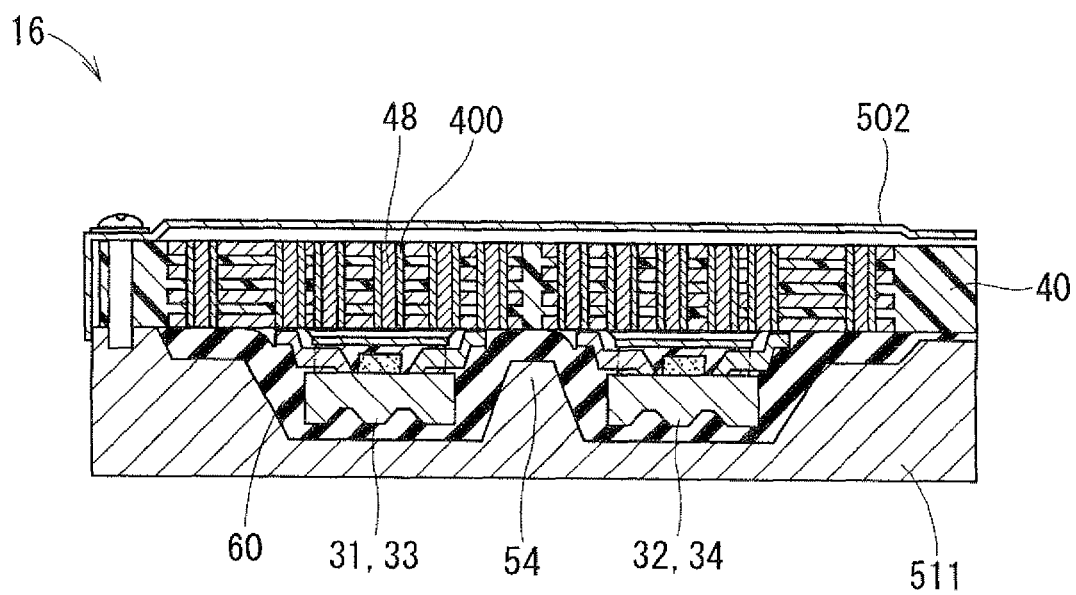
FIG. 20 is a cross-sectional view showing a main part of an electronic control unit according to a sixteenth embodiment of the present invention.

As shown in FIG. 20, in an electronic control unit 16 of the present embodiment, the lower case 511 is made of an aluminum die-casting product. Further, the lower case 511 has a projection 54 that projects to a side of the circuit board 40 between the MOSs 31, 33 and the MOSs 32, 34. The projection 54 can limit the movement of the heat releasing gel 60. The reference numeral 502 indicates an upper case 502.

The through holes 400 are filled with the solder 48, and thereby the movement of the heat releasing gel 60 toward the surface side from the rear surface side of the circuit board 40 is limited.

In the present embodiment, the lower case 511 is made of the aluminum die-casting product, and thus the heat capacity of the lower case 511 is increased and the heat releasing performance can be improved.

Seventeenth Embodiment

Figure 21:
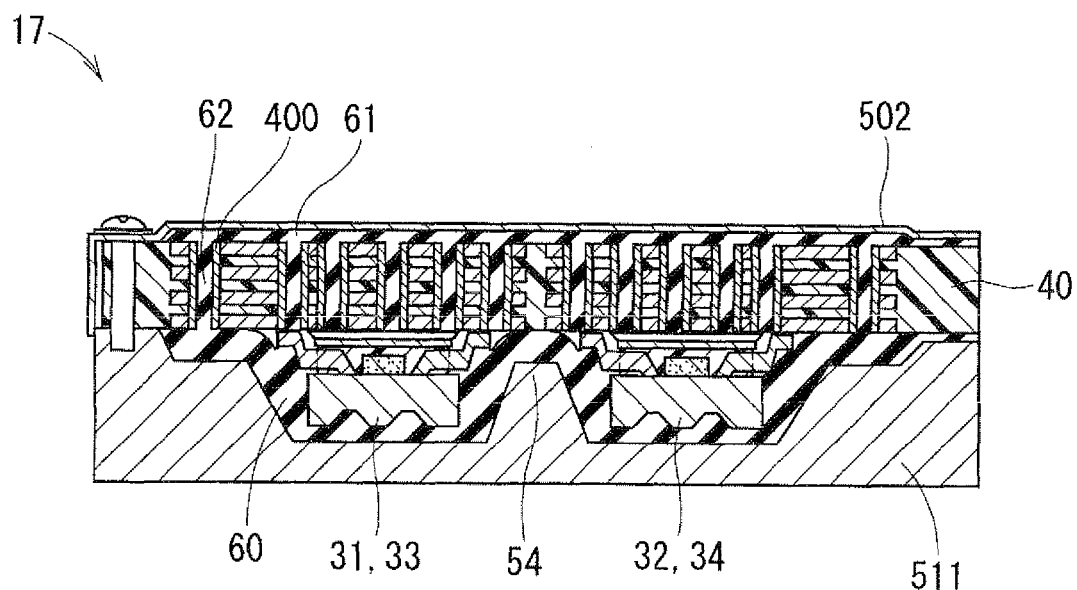
FIG. 21 is a cross-sectional view showing a main part of an electronic control unit according to a seventeenth embodiment of the present invention.

As shown in FIG. 21, in an electronic control unit 17 of the present embodiment, the heat releasing gel 61 is formed between the upper case 502 and the circuit board 40. The heat releasing gel 60 is formed between the lower case 511 and the circuit board 40. Furthermore, the through holes 400 in the circuit board 40 are filled with the heat releasing gel 62.

Thus, heat generated from the MOSs 31 to 34 is conducted to both the upper case 502 and the lower case 511 by the heat releasing gels 60 to 62. The heat conducted to the upper case 502 and the lower case 511 is released into the air or the like. Therefore, in the electronic control unit 17, the heat releasing performance can be improved.

Eighteenth Embodiment

Figure 22:
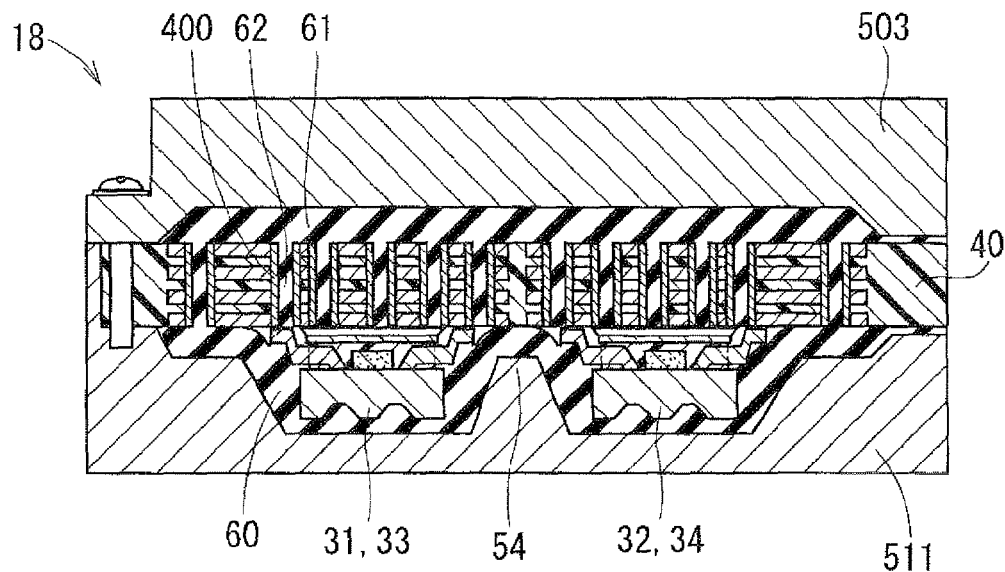
FIG. 22 is a cross-sectional view showing a main part of an electronic control unit according to an eighteenth embodiment of the present invention.

As shown in FIG. 22, in an electronic control unit 18 of the present embodiment, each of an upper case 503 and the lower case 511 is made of an aluminum die-casting product.

The heat releasing gel 61 is formed between the upper case 503 and the circuit board 40. The heat releasing gel 60 is formed between the lower case 511 and the circuit board 40. Furthermore, the through holes 400 in the circuit board 40 are filled with the heat releasing gel 62.

Thus, heat generated from the MOSs 31 to 34 is conducted to both the upper case 503 and the lower case 511 by the heat releasing gels 60 to 62.

In the present embodiment, each of the upper case 503 and the lower case 511 is made of the aluminum die-casting product, and thus the heat capacity of each of the upper case 503 and the lower case 511 is increased and the heat releasing performance can be improved.

Nineteenth Embodiment

Figure 23:
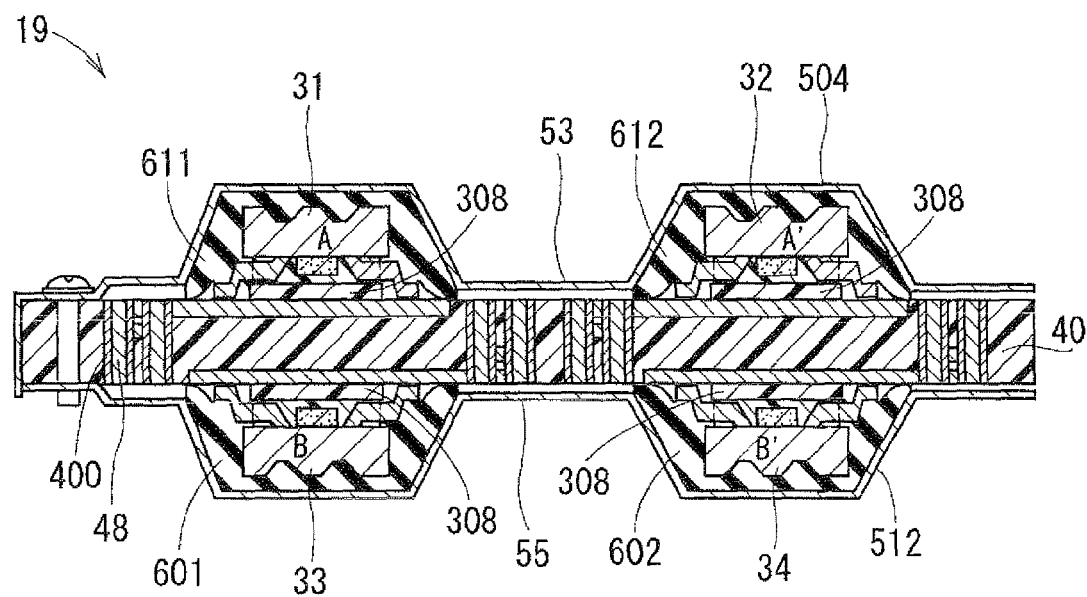
FIG. 23 is a cross-sectional view showing a main part of an electronic control unit according to a nineteenth embodiment of the present invention.

As shown in FIG. 23, an electronic control unit 19 of the nineteenth embodiment is configured by forming an upper case 504, a lower case 512 and heat releasing gels 601, 602, 611, 612 on the electronic control unit 7 of the seventh embodiment. The present embodiment is applied to the electronic control unit 19 which uses current equal to or more than 33 A, for example.

Each of the upper case 504 and the lower case 512 is made of an aluminum plate or a galvanized sheet, for example, and thereby the electronic control unit 19 is reduced in size and weight. Furthermore, the through holes 400 in the circuit board 40 are filled with the solder 48.

The heat releasing gels 611, 612, 601, 602 are respectively formed in the MOSs 31 to 34, and the movement of the heat releasing gels 611, 612, 601, 602 is limited by the projection 53 of the upper case 504 and a projection 55 of the lower case 512.

In the present embodiment, the thermal interference between the MOSs 31 to 34 can be limited by reducing the thermal conduction between each of the MOSs 31 to 34. Moreover, the heat releasing performance can be improved by the thermal conducting path means including the heat releasing gels 611, 612, 601, 602 and the solder 48.

Twentieth Embodiment

Figure 24:
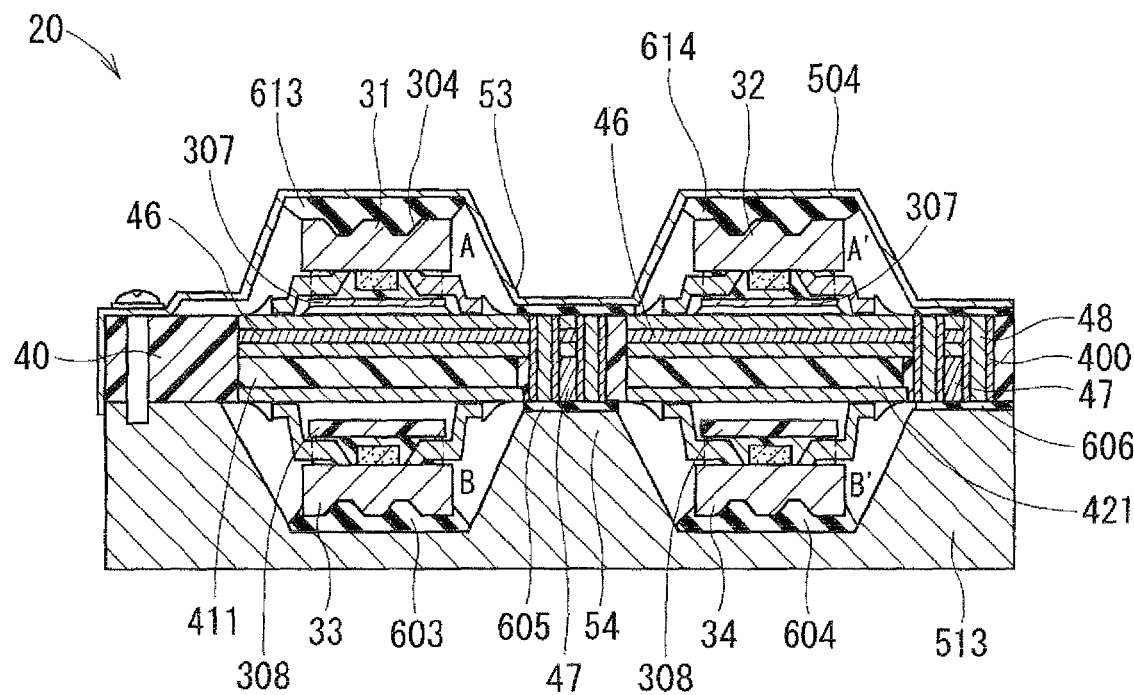
FIG. 24 is a cross-sectional view showing a main part of an electronic control unit according to a twentieth embodiment of the present invention.

As shown in FIG. 24, an electronic control unit 20 of the twentieth embodiment is configured by forming the upper case 504, a lower case 513 and heat releasing gels 603, 604, 613, 614 on the electronic control unit 13 of the thirteenth embodiment. The present embodiment is applied to the electronic control unit 20 which uses current equal to or more than 65 A, for example.

The upper case 504 is made of an aluminum plate or a galvanized sheet, for example, and thereby the electronic control unit 20 is reduced in size and weight. The lower case 513 is made of an aluminum die-casting product. Furthermore, the through holes 400 in the circuit board 40 are filled with the solder 48.

The movement of the heat releasing gel 613 that releases heat generated from the A_MOS 31, the heat releasing gel 614 that releases heat generated from the A'_MOS 32, the heat releasing gel 603 that releases heat generated from the B_MOS 33 and the heat releasing gel 604 that releases heat generated from the B'_MOS 34 is limited by an irregular surface formed on the heat releasing plate 304 in each of the MOSs 31 to 34.

In the present embodiment, heat generated from the A_MOS 31 and the A'_MOS 32 is released into the air from the upper case 504 via the heat releasing gels 613, 614, and is released to the lower case 513 via the first and second high thermal-conductive layers 46, 47 and heat releasing gels 605, 606. In contrast, heat generated from the B_MOS 33 and the B'_MOS 34 is released to the lower case 513 via the heat releasing gels 603, 604.

Furthermore, the thermal conduction between each of the MOSs 31 to 34 is reduced by the second low thermal-conductive layers 411, 421, the low thermal-conductive member 308 and the like, and thereby the thermal interference of each of the MOSs 31 to 34 is limited.

Accordingly, the quantity and the location of the heat releasing gel are changed based on a condition where the electronic control unit is applied so that a heat releasing path can be set and the degree of freedom of a design of the electronic control unit can be increased. Furthermore, the amount of the heat releasing gel can be saved, and the cost can be reduced.

Twenty-First Embodiment

Figure 25:
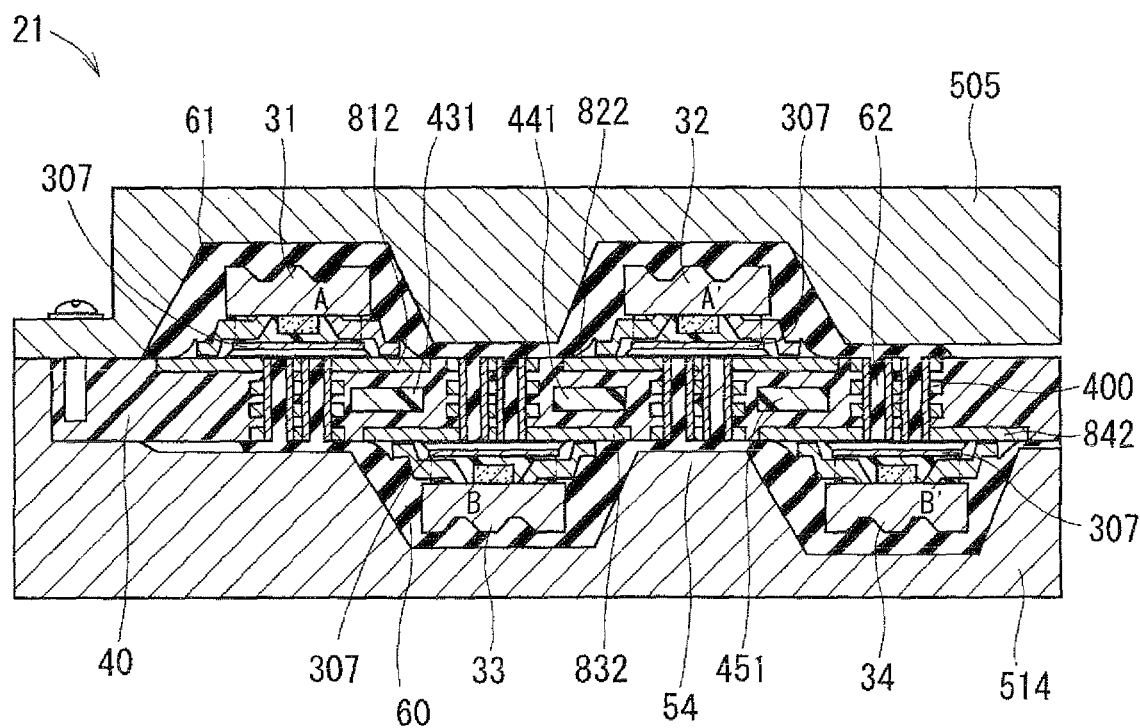
FIG. 25 is a cross-sectional view showing a main part of an electronic control unit according to a twenty-first embodiment of the present invention.

As shown in FIG. 25, an electronic control unit 21 of the twenty-first embodiment is configured by forming an upper case 505, a lower case 514 and the heat releasing gels 60, 61, 62 on the electronic control unit 11 of the eleventh embodiment. The present embodiment is applied to the electronic control unit 21 which uses current equal to or more than 80 A, for example.

Each of the upper case 505 and the lower case 514 is made of an aluminum die-casting product. Furthermore, the through holes 400 in the circuit board 40 are filled with the heat releasing gel 62. The heat releasing gel 60 is formed between the circuit board 40 and the lower case 514, and the heat releasing gel 61 is formed between the circuit board 40 and the upper case 505.

In the present embodiment, heat generated from the A_MOS 31 and the A'_MOS 32 is released to the upper case 505 via the heat releasing gel 61, and is released to the lower case 514 via the circuit patterns 812, 822, the through holes 400 and the heat releasing gels 62, 60.

In contrast, heat generated from the B_MOS 33 and the B'_MOS 34 is released to the lower case 514 via the heat releasing gel 60, and is released to the upper case 505 via the circuit patterns 832, 842, the through holes 400 and the heat releasing gels 62, 61.

Furthermore, the thermal conduction between each of the MOSs 31 to 34 is reduced by the second low thermal-conductive layers 431, 441, 451, and thereby the thermal interference of each of the MOSs 31 to 34 is limited.

Twenty-Second Embodiment

Figure 26:
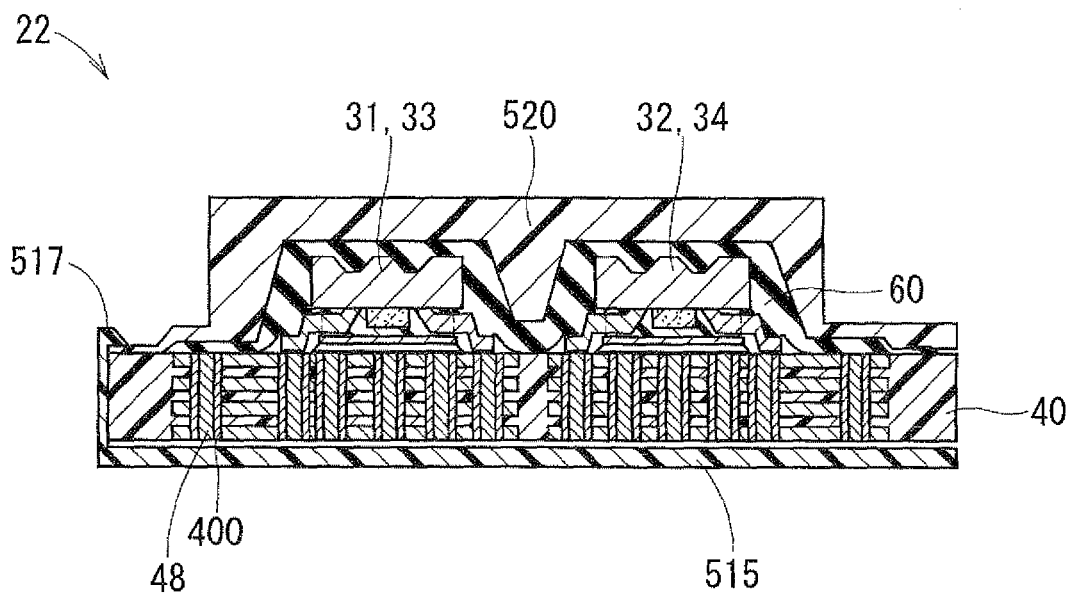
FIG. 26 is a cross-sectional view showing a main part of an electronic control unit according to a twenty-second embodiment of the present invention.

As shown in FIG. 26, in an electronic control unit 22 of the present embodiment, an upper case 520 is made of high thermal-conductive resin. For example, the materials described in the thirteenth embodiment as the first and second high thermal-conductive layers can be used for the upper case 520.

The heat releasing gel 60 is formed between the upper case 520 and the circuit board 40. A lower case 515 is made of resin. A claw 517 formed at an end portion of the lower case 515 is engaged with the upper case 520 so that the upper case 520 and the lower case 515 are coupled.

The through holes 400 are filled with the solder 48, and thereby the movement of the heat releasing gel 60 toward the rear surface side from the surface side of the circuit board 40 is limited.

In the present embodiment, the upper case 520 is made of high thermal-conductive resin and the lower case 515 is made of resin, and thereby the upper case 520 and the lower case 515 can be reduced in weight and the heat releasing performance can be improved. Moreover, since a forming process of the case becomes easy, a manufacturing cost can be reduced.

Twenty-Third Embodiment

Figure 27:
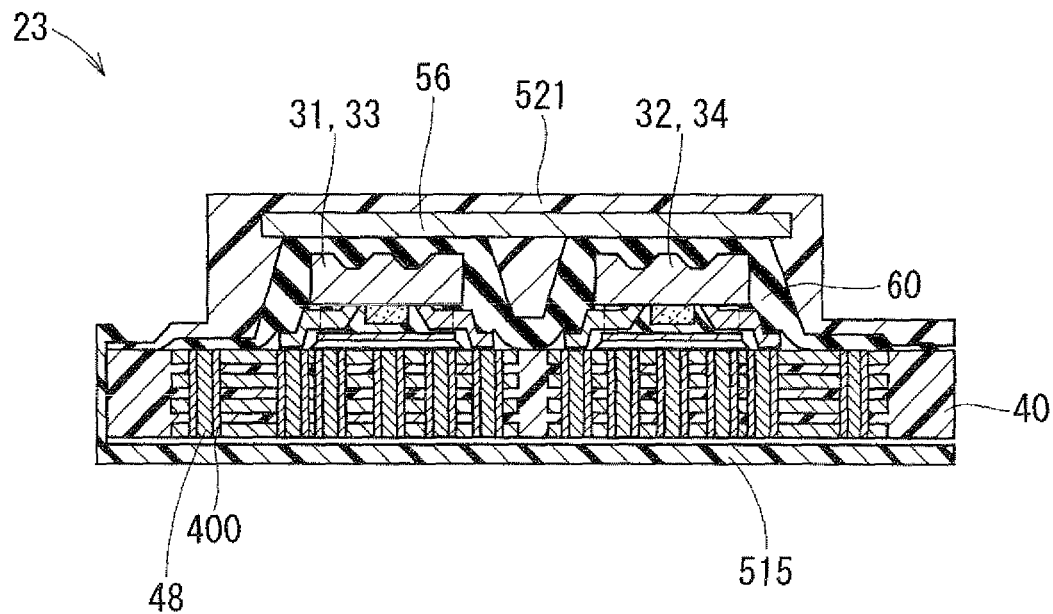
FIG. 27 is a cross-sectional view showing a main part of an electronic control unit according to a twenty-third embodiment of the present invention.

As shown in FIG. 27, in an electronic control unit 23 of the present embodiment, a metal plate 56 is molded in an upper case 521 made of resin or high thermal-conductive resin. For example, the metal plate 56 is made of aluminum or the like, and one side surface of the metal plate 56 is exposed to a side of the MOSs 31 to 34.

By setting a thickness and volume of the metal plate 56 depending on a value of current which flows in the MOSs 31 to 34, the heat capacity of the metal plate 56 can be adjusted to the heat release quantity of the MOSs 31 to 34. Therefore, in the present embodiment, heat generated from the MOSs 31 to 34 can be released with high efficiency by the metal plate 56 buried in the upper case 521.

Twenty-Fourth Embodiment

Figure 28:
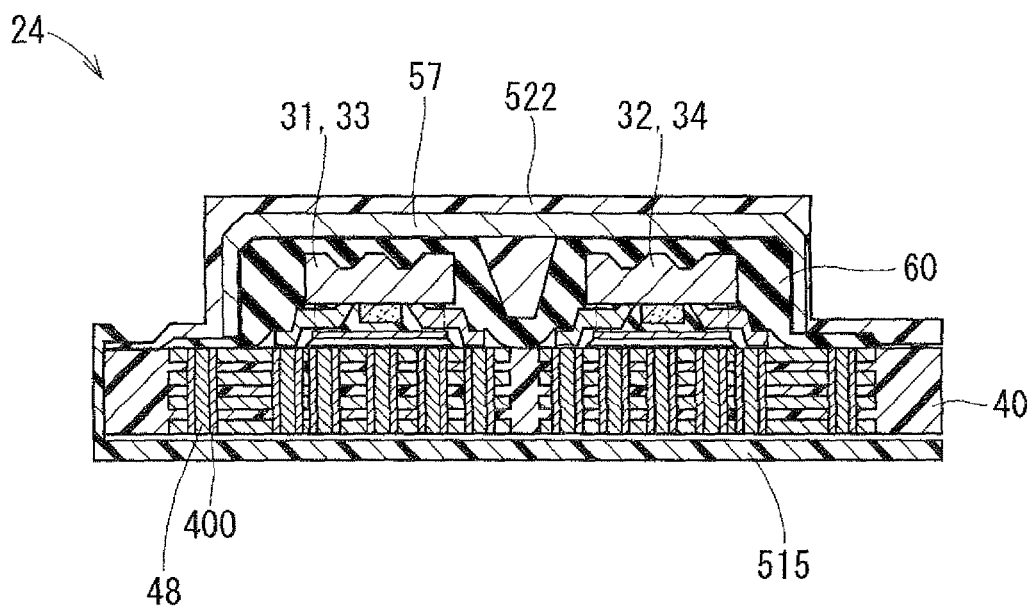
FIG. 28 is a cross-sectional view showing a main part of an electronic control unit according to a twenty-fourth embodiment of the present invention.

As shown in FIG. 28, in an electronic control unit 24 of the present embodiment, a metal plate 57 is formed to surround top surfaces and side surfaces of the MOSs 31 to 34 in an upper case 522, and thereby an area of the metal plate 57, which is exposed to a side of the MOSs 31 to 34, is increased. The heat releasing gel 60 is formed between the MOSs 31 to 34 and the metal plate 57. Therefore, in the present embodiment, the thermal conductive efficiency of the metal plate 57 can be increased, and the heat released from the top surfaces and the side surfaces of the MOSs 31 to 34 can be conducted with high efficiency.

Twenty-Fifth Embodiment

Figure 29:
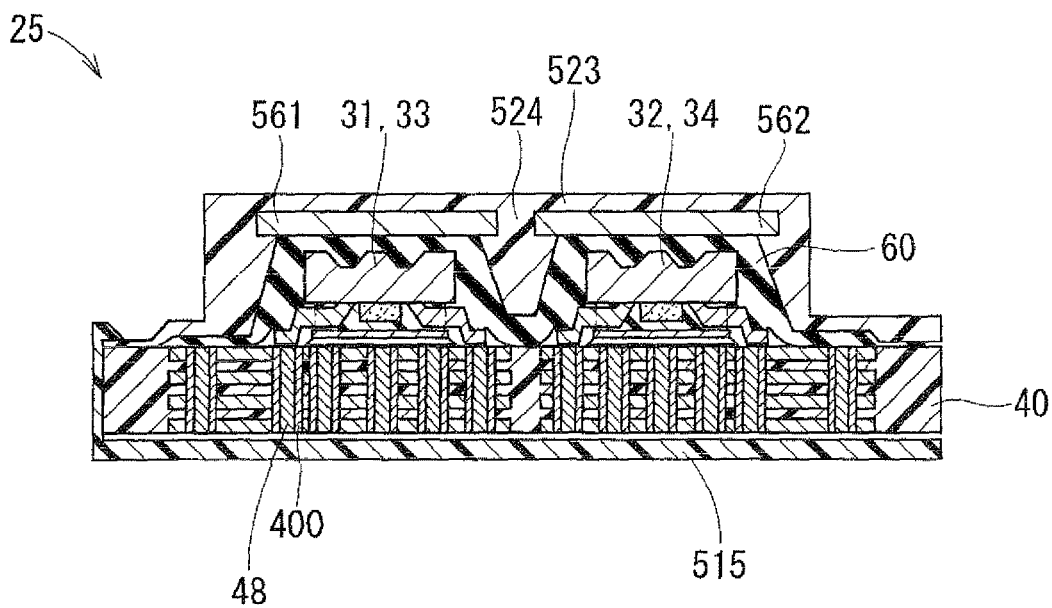
FIG. 29 is a cross-sectional view showing a main part of an electronic control unit according to a twenty-fifth embodiment of the present invention.

As shown in FIG. 29, in an electronic control unit 25 of the present embodiment, a first metal plate 561 and a second metal plate 562 are formed on each of the MOSs 31 to 34 at an opposite side of the circuit board 40. The first metal plate 561 and the second metal plate 562 are separately molded in an upper case 523 made of resin. A thermal-interference limiting portion 524 is formed between the first metal plate 561 and the second metal plate 562. The thermal-interference limiting portion 524 is made of the resin configuring the upper case 523. Generally, since the thermal resistance of resin is large, the thermal conduction between the first metal plate 561 and the second metal plate 562 can be limited. Moreover, the low thermal-conductive layer described in the fourth, ninth, eleventh embodiments may be formed in the thermal-interference limiting portion 524. According to the configuration, heat generated from the MOSs 31 to 34 is thermally conducted to the heat releasing gel 60 and each of the first metal plate 561 and the second metal plate 562, and thereby the thermal interference between the MOSs 31 to 34 can be limited.

In addition, the first metal plate 561 and the second metal plate 562 may be formed to surround the corresponding MOS as described in the twenty-fourth embodiment. Accordingly, the thermal conductive efficiency of the first metal plate 561 and the second metal plate 562 can be improved, and the thermal interference between the MOSs 31 to 34 can be limited.

Twenty-Sixth Embodiment

Figure 30:
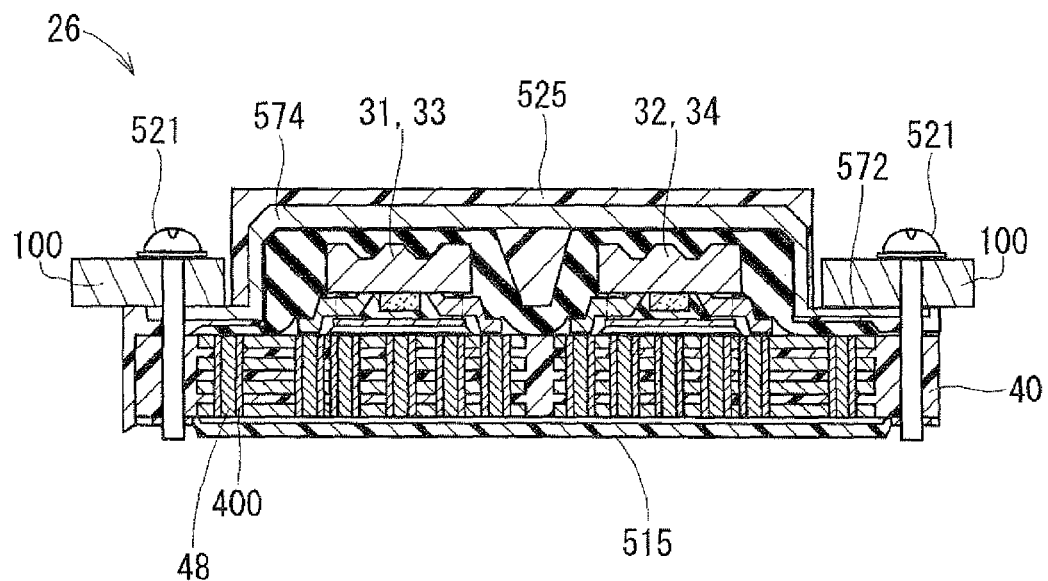
FIG. 30 is a cross-sectional view showing a main part of an electronic control unit according to a twenty-sixth embodiment of the present invention.

As shown in FIG. 30, in an electronic control unit 26 of the present embodiment, an end portion of a metal plate 574 is exposed to the outside of an upper case 525. For example, an exposed surface 572 of the metal plate 574 is connected to a column 100 of a steering shaft by a screw 521 so that heat generated from the MOSs 31 to 34 can be released to the outside column 100 having large heat capacity from the metal plate 574. Therefore, the heat releasing performance can be improved.

Twenty-Seventh Embodiment

Figure 31:
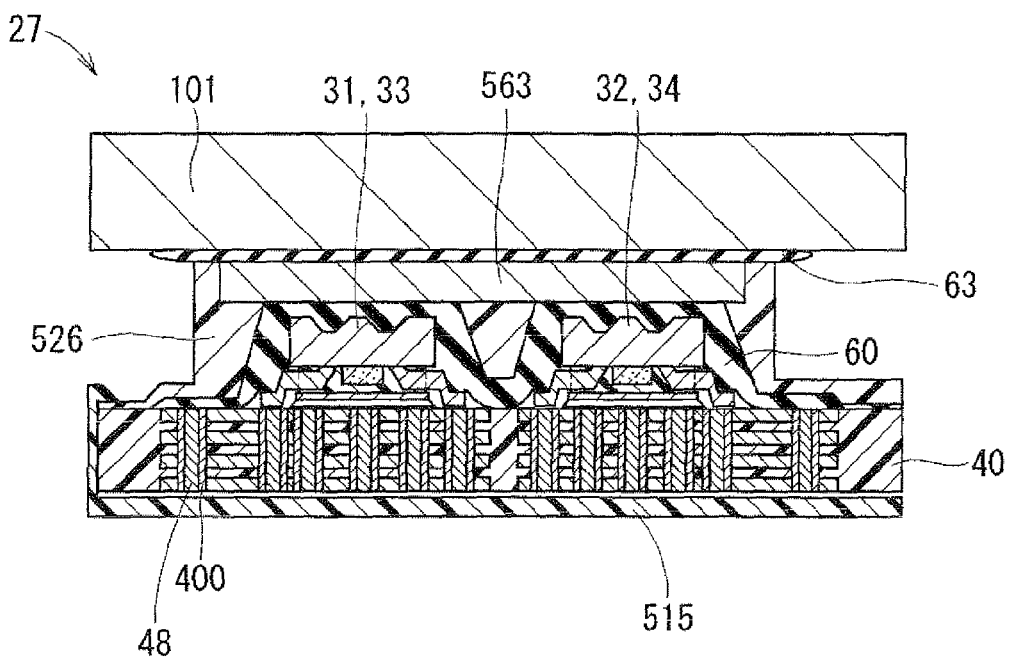
FIG. 31 is a cross-sectional view showing a main part of an electronic control unit according to a twenty-seventh embodiment of the present invention.

As shown in FIG. 31, in an electronic control unit 27 of the present embodiment, one side surface of a metal plate 563, which is molded in an upper case 526, is exposed to a side of the MOSs 31 to 34 and the other side surface of the metal plate 563 is exposed to the opposite side of the MOSs 31 to 34. The other side of the metal plate 563 is connected to a steering column shaft 101, for example. A heat releasing gel 63 is formed to improve the thermal conductive efficiency between the metal plate 563 and the column shaft 101.

Accordingly, heat generated from the MOSs 31 to 34 is directly released to the column shaft 101 having large heat capacity via the heat releasing gel 60, the metal plate 563 and the heat releasing gel 63. The heat generated from the MOSs 31 to 34 can be directly released to the opposite side of the circuit board 40 by shortening the distance between the column shaft 101 and the MOSs 31 to 34.

Twenty-Eighth Embodiment

Figure 32:
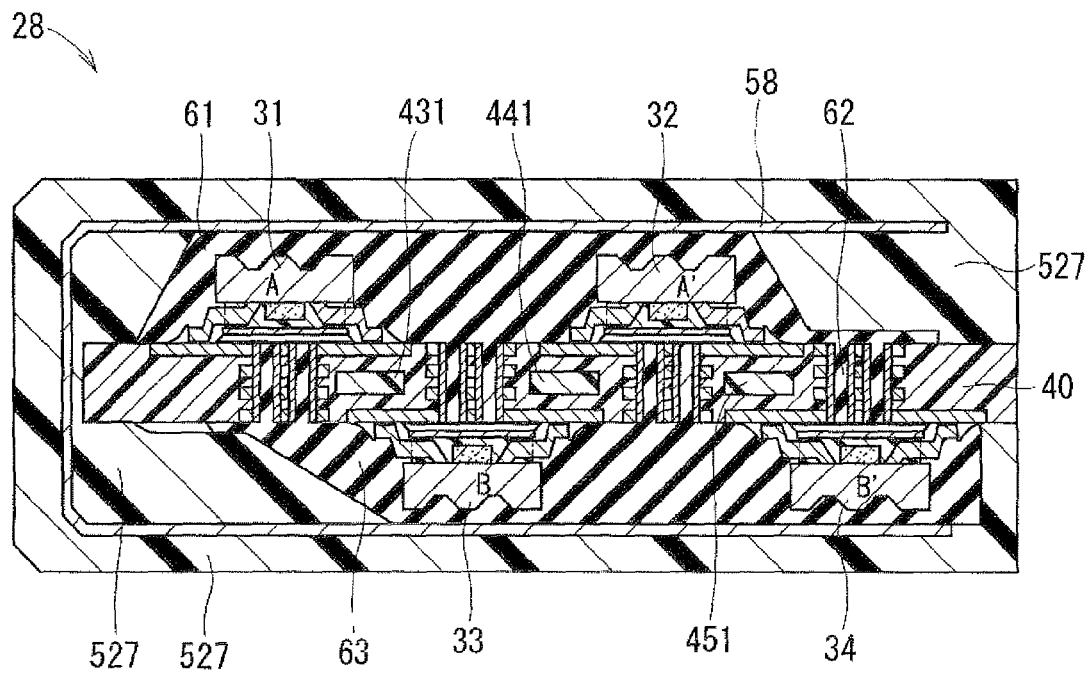
FIG. 32 is a cross-sectional view showing a main part of an electronic control unit according to a twenty-eighth embodiment of the present invention.

As shown in FIG. 32, in an electronic control unit 28 of the present embodiment, a metal plate 58 is formed to surround the A_MOS 31 and the A'_MOS 32, which are placed on the surface of the circuit board 40, and the B_MOS 33 and the B'_MOS 34, which are placed on the rear surface of the circuit board 40. In the present embodiment, the circuit board 40 on which the MOSs 31 to 34 are placed is inserted into a case 527 from a front side to a back side of the paper plane of FIG. 32 or from the back side to the front side of the paper plane of FIG. 32 so that the circuit board 40 and the case 527 are combined.

A metal plate covering the A_MOS 31 and the A'_MOS 32, which are placed on the surface of the circuit board 40, and a metal plate covering the B_MOS 33 and the B'_MOS 34, which are placed on the rear surface of the circuit board 40 are integrally formed, and the metal plate is formed to be a C-shape. Thus, heat generated from the MOSs 31 to 34 can be released with high efficiency. By molding the metal plate 58 in the case 527, the rigidity of the case 527 can be increased.

Furthermore, by forming the metal plate 58 to be a cylindrical shape, the rigidity and the heat releasing performance of the case 527 can be further increased.

Other Embodiments

In the above-described embodiments, the electronic control unit for controlling a motor of an EPS is shown. In contrast, the electronic control unit of the present invention may be an electronic control unit for controlling VVT (Variable Valve Timing) that switches timing of opening and closing of a valve, for example.

In the above-described embodiments, the FR-4 is shown as an example of a resin circuit board containing resin. In contrast, the resin circuit board used in the present invention may be a rigid circuit board such as an FR-5 and a CEM-3, or a flexible circuit board.

In the above-described embodiments, the power MOSFET is shown as an example of a semiconductor device. In contrast, the semiconductor device used in the present invention may be an FET (Field Effect Transistor), an SBD (Schottky Barrier Diode) or an IGBT (Insulated Gate Bipolar Transistor).

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electronic control unit comprising:
a circuit board;
a plurality of circuit patterns, which are formed on the circuit board;
a plurality of semiconductor devices, each of which is installed to a corresponding one of the plurality of circuit patterns;
a plurality of leads, each of which electrically and mechanically connects between the corresponding one of the plurality of circuit patterns and a corresponding one of the plurality of semiconductor devices; and
at least one thermal-conduction limiting portion, which is placed between corresponding two of the plurality of circuit patterns and that limits conduction of heat, which is generated from at least one of the plurality of semiconductor devices upon operation thereof, between the corresponding two of the plurality of circuit patterns, wherein
the plurality of circuit patterns includes first to fourth circuit patterns,
the plurality of semiconductor devices includes first to fourth semiconductor devices,
the plurality of leads includes first to fourth leads,
the first to fourth semiconductor devices are installed to the first to fourth circuit patterns, respectively,
the first to fourth leads electrically and mechanically connect the first to fourth semiconductor devices to the first to fourth circuit patterns, respectively, to form an H-bridge circuit,
the first and second semiconductor devices are configured to be energized simultaneously and are placed obliquely with respect to each other on the circuit board,
the third and fourth semiconductor devices are configured to be energized simultaneously and are placed obliquely with respect to each other on the circuit board, and
the thermal-conduction limiting portion limits conduction of heat, generated by the first to fourth semiconductor devices, between the first to fourth circuit patterns.

2. The electronic control unit according to claim 1, wherein a corresponding one of the at least one thermal-conduction limiting portion is placed at a location between one of the corresponding two of the plurality of circuit patterns and a corresponding one of the plurality of leads, which is connected to the semiconductor device that is installed to the other one of the corresponding two of the plurality of circuit patterns.

3. The electronic control unit according to claim 1, wherein the thermal-conduction limiting portion includes a groove portion which is dented in a thickness direction of the circuit board.

4. The electronic control unit according to claim 3, wherein the thermal-conduction limiting portion includes a first low thermal-conductive layer having low thermal conductivity in the groove portion.

5. The electronic control unit according to claim 1, wherein
the first and second semiconductor devices are placed on a first surface of the circuit board, and
the third and fourth semiconductor devices are placed on a second surface of the circuit board, which is opposite from the first surface of the circuit board.

6. The electronic control unit according to claim 1, further comprising
a thermal conducting path means for conducting the heat, which is generated from the at least one of the plurality of semiconductor devices, wherein
the thermal conducting path means is formed in the circuit board and on at least one of a first surface of the circuit board and a second surface of the circuit board, which is opposite from the first surface of the circuit board.

7. The electronic control unit according to claim 6, wherein
the thermal conducting path means includes a through hole that communicates between the first surface and the second surface of the circuit board, and
an end portion of the through hole is connected to an adjacent one of the plurality of circuit patterns.

8. The electronic control unit according to claim 1, wherein
the at least one of the plurality of semiconductor devices includes a low thermal-conductive member having low thermal conductivity at a side of the circuit board.

9. The electronic control unit according to claim 1, wherein
one of the plurality of leads, which is connected to the corresponding one of the plurality of semiconductor devices, extends to a location, which is on a side of the corresponding semiconductor device where the circuit board is located, so that a space is defined between the circuit board and the corresponding semiconductor devices.

10. The electronic control unit according to claim 1, further comprising
a second low thermal-conductive layer in the circuit board, wherein
at least one of the plurality of semiconductor devices is placed on a first surface of the circuit board,
at least another one of the plurality of semiconductor devices is placed on a second surface of the circuit board, which is opposite from the first surface of the circuit board, and
the second low thermal-conductive layer is adapted to limit conduction of heat, which is generated from the plurality of semiconductor devices placed on the first surface and the second surface of the circuit board.

11. The electronic control unit according to claim 10, wherein
the second low thermal-conductive layer extends along an extending direction of the circuit board.

12. The electronic control unit according to claim 1, wherein
the first semiconductor device is placed on a first surface of the circuit board,
the second semiconductor device is placed on a second surface of the circuit board, which is opposite from the first surface of the circuit board, and
the second semiconductor device is placed away from a location directly below the first semiconductor device.

13. The electronic control unit according to claim 6, wherein
the thermal conducting path means is placed directly below the at least one of the plurality of semiconductor devices, which is placed on the at least one of the first surface and the second surface of the circuit board.

14. The electronic control unit according to claim 7, further comprising
an inner layer pattern formed in the circuit board, wherein
the thermal conducting path means includes a first high thermal-conductive layer between the inner layer pattern and the adjacent one of the plurality of circuit patterns formed on at least one of the first surface and the second surface of the circuit board.

15. The electronic control unit according to claim 7, wherein the thermal conducting path means includes a second high thermal-conductive layer in the through hole.

16. The electronic control unit according to claim 1, further comprising:
a heat releasing gel; and
a case for protecting the plurality of semiconductor devices, wherein
the heat releasing gel is placed between the plurality of semiconductor devices and the case to conduct the heat, which is generated from the at least one of the plurality of semiconductor devices, to the case.

17. The electronic control unit according to claim 16, wherein
the case has a projection that projects to a side of the circuit board, and
the projection is located between corresponding two of the plurality of semiconductor devices.

18. The electronic control unit according to claim 16, wherein
the heat releasing gel is placed on a first surface of the circuit board and a second surface of the circuit board, which is opposite from the first surface of the circuit board.

19. The electronic control unit according to claim 16, wherein
the case is made of an aluminum die-casting product.

20. The electronic control unit according to claim 16, wherein
the heat releasing gel is placed on each of the plurality of semiconductor devices.

21. The electronic control unit according to claim 16, wherein
the case is made of high thermal-conductive resin.

22. The electronic control unit according to claim 16, further comprising
a metal plate integrally formed with the case, wherein
one side surface of the metal plate is exposed to a side of the plurality of semiconductor devices.

23. The electronic control unit according to claim 22, wherein
the metal plate surrounds top surfaces and side surfaces of the plurality of semiconductor devices.

24. The electronic control unit according to claim 22, wherein
the metal plate is placed on each of the plurality of semiconductor devices.

25. The electronic control unit according to claim 22, wherein
an end portion of the metal plate is exposed to an outside of the case.

26. The electronic control unit according to claim 22, wherein
the other side surface of the metal plate is exposed to an opposite side of the plurality of semiconductor devices.

27. The electronic control unit according to claim 22, wherein
at least one of the plurality of semiconductor devices is placed on a first surface of the circuit board,
at least another one of the plurality of semiconductor devices is placed on a second surface of the circuit board, which is opposite from the first surface of the circuit board, and
the metal plate surrounds top surfaces and side surfaces of the plurality of semiconductor devices placed on the first surface and the second surface of the circuit board.

28. The electronic control unit according to claim 1, wherein the first to fourth semiconductor devices are arranged in a diamond pattern.

* * * * *